United States Patent
Wang et al.

(10) Patent No.: US 7,162,091 B2
(45) Date of Patent: Jan. 9, 2007

(54) INTRA COMPRESSION OF PIXEL BLOCKS USING PREDICTED MEAN

(75) Inventors: Albert S. Wang, Palo Alto, CA (US); Sanjeev Mehrotra, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 787 days.

(21) Appl. No.: 10/403,780

(22) Filed: Mar. 31, 2003

(65) Prior Publication Data

US 2003/0185452 A1    Oct. 2, 2003

Related U.S. Application Data

(63) Continuation of application No. 08/850,957, filed on May 5, 1997, now Pat. No. 6,571,016.

(51) Int. Cl.
*G06K 9/36* (2006.01)
*G06K 9/46* (2006.01)

(52) U.S. Cl. .................. 382/233; 382/236; 382/238

(58) Field of Classification Search ............... 382/233, 382/236, 238; 375/240.13
See application file for complete search history.

(56) References Cited

U.S. PATENT DOCUMENTS

| | | | |
|---|---|---|---|
| 5,068,724 A | 11/1991 | Krause et al. | |
| 5,144,425 A | 9/1992 | Joseph | |
| 5,155,594 A | 10/1992 | Bernstein et al. | |
| 5,227,878 A | 7/1993 | Puri et al. | |
| 5,260,783 A * | 11/1993 | Dixit ................ | 375/240.13 |
| 5,351,095 A | 9/1994 | Kerdranvat | |
| 5,414,469 A | 5/1995 | Gonzales et al. | |
| 5,418,568 A | 5/1995 | Keith | |
| 5,442,400 A | 8/1995 | Sun et al. | |
| 5,453,801 A | 9/1995 | Kim | |
| 5,467,086 A | 11/1995 | Jeong | |
| 5,467,134 A | 11/1995 | Laney et al. | |
| 5,473,379 A | 12/1995 | Horne | |
| 5,502,492 A | 3/1996 | Jung | |
| 5,512,952 A | 4/1996 | Iwamura | |
| 5,521,988 A | 5/1996 | Li et al. | |
| 5,537,155 A | 7/1996 | O'Connell et al. | |
| 5,544,286 A | 8/1996 | Laney | |
| 5,557,341 A | 9/1996 | Weiss et al. | |
| 5,560,038 A | 9/1996 | Haddock | |

(Continued)

FOREIGN PATENT DOCUMENTS

EP        279053        8/1988

OTHER PUBLICATIONS

Navin Chaddha, Mohan Vishwanath and Philip A Chou, "Hierarchical Vector Quantization of Perceptually Weighted Block Transforms—Data Compression Conference", IEEE Computer Society Press, Los Alamitos, California, Mar. 28-30, 1995.

(Continued)

*Primary Examiner*—Phuoc Tran
(74) *Attorney, Agent, or Firm*—Klarquist Sparkman, LLP

(57) ABSTRACT

An apparatus and method for encoding video frames is provided. The video frames are divided into blocks for encoding. Encoding of the video blocks utilizes motion detection, motion estimation and adaptive compression, to obtain the desired compression for a particular bit rate. Adaptive compression includes intra compression (without regard to other frames) and inter compression (with regard to other frames). Intra compression, inter compression with motion detection, and inter compression with motion estimation are performed on a block by block basis, as needed. Segmentation is provided to compare encoding of a block with encoding of its sub-blocks, and to select the best block size for encoding.

22 Claims, 17 Drawing Sheets

U.S. PATENT DOCUMENTS

| | | | |
|---|---|---|---|
| 5,576,767 | A | 11/1996 | Lee et al. |
| 5,585,852 | A | 12/1996 | Agarwal |
| 5,596,659 | A | 1/1997 | Normile et al. |
| 5,604,867 | A | 2/1997 | Harwood |
| 5,623,312 | A | 4/1997 | Yan et al. |
| 5,623,313 | A | 4/1997 | Naveen |
| 5,673,265 | A | 9/1997 | Gupta et al. |
| 5,694,173 | A | 12/1997 | Kimura et al. |
| 5,764,814 | A | 6/1998 | Chen et al. |
| 5,778,098 | A | 7/1998 | Lee et al. |
| 5,799,113 | A | 8/1998 | Lee |
| 5,802,213 | A | 9/1998 | Gardos |
| 5,946,043 | A | 8/1999 | Lee et al. |
| 5,952,943 | A | 9/1999 | Walsh et al. |
| 5,959,673 | A | 9/1999 | Lee et al. |
| 5,970,173 | A | 10/1999 | Lee et al. |
| 6,058,212 | A | 5/2000 | Yokoyama |
| 6,148,109 | A | 11/2000 | Boon et al. |
| 6,215,425 | B1 | 4/2001 | Andrews et al. |
| 6,215,910 | B1 | 4/2001 | Chaddha |
| 6,236,764 | B1 | 5/2001 | Zhou |
| 6,281,942 | B1 | 8/2001 | Wang |
| 6,292,588 | B1 | 9/2001 | Shen et al. |
| 6,300,888 | B1 | 10/2001 | Chen et al. |
| 6,339,656 | B1 | 1/2002 | Marui |
| 6,571,016 | B1 | 5/2003 | Mehrotra et al. |
| 6,654,419 | B1 | 11/2003 | Sriram et al. |
| 2002/0097802 | A1 | 7/2002 | Lin et al. |
| 2005/0135484 | A1 | 6/2005 | Lee et al. |

OTHER PUBLICATIONS

International Telecommunication Union, "Series H: Audiovisual and Multimedia Systems Infrastructure of Audiovisual Services-Coding of Moving Video" "Video Coding for Low Bit Rate Communication", pp. 1-154, Feb. 1998.

Reader, "History of MPEG Video Compression—Ver. 4.0," 99 pp., document marked Dec. 16, 2003.

ISO/IEC, "ISO/IEC 11172-2, Information technology—Coding of moving pictures and associated audio of digital storage media at up to about 1,5 Mbit/s—Part 2: Video," 112 pp. (1993).

ISO/IEC, "JTC1/SC29/WG11 N2202, Information Technology—Coding of Audio-Visual Objects: Visual, ISO/IEC 14496-2," 329 pp. (1998).

ITU-T, "ITU-T Recommendation H.261, Video Codec for Audiovisual Services at p x 64 kbits," 25 pp. (1993).

ITU-T, "ITU-T Recommendation H.262, Information Technology—Generic Coding of Moving Pictures and Associated Audio Information: Video," 205 pp. (1995).

ITU-T, "ITU-T Recommendation H.263, Video coding for low bit rate communication," 162 pp. (1998).

Printouts of FTP directories from http://ftp3.itu.ch , 8 pp. (downloaded from the World Wide Web on Sep. 20, 2005.).

Wang et al., "Lossless Wavelet Coder with Adaptive Orientional Prediction," *TENCON '99*, 3 pp. (1999).

CCITT Recommendation T.81, "Digital Compression and Coding of Continuous-Tone Still Images," pp. 1-20, H-1-H-6 (1992).

Fernandez I Ubiergo, "Lossless Region-based Multispectral Image Compression," *6th Int'l Conf. on Image Processing and its Applications*, vol. 1, 5 pp. (1997).

Guenter et al., "Motion Compensated Compression of Computer Animation Frames," *Proc. SIGGRAPH 93*, 8 pp. (1993).

Heising et al., "Video Coding Using Spatial Extrapolation Based Motion Field Segmentation," *IEEE Int. Conf. Image Processing*, vol. 2, 4 pp. (1996).

ITU-T Recommendation H. 263, "Series H: Audiovidual and Multimedia Systems, Infrastructure of Audio visual Services—Coding of Moving Video," International Telecommunication Union, pp. i-x, 4, 73-84 (Feb. 1998).

Liang et al., "Fast Multiplierless Approximation of the DCT with the Lifting Scheme," *Proc. SPIE Apps. Of Digital Image Processing XXIII*, 12 pp. (Aug. 2000).

Mehrotra et al., "Adaptive Coding Using Finite State Hierarchical Table Lookup Vector Quantization with Variable Block Sizes," 5 pp. (1996).

Pennebaker et al., "JPEG: Still Image Data Compression Standard," Van Nostrand Reinhold, New York, pp. vii-xi, 92-93, 109-116, 182-185, 190-198, 257,259, 332-333, 631 (1993).

Study Group 16—Contribution 999, "Draft Text of Recommendation H.263 Version 2 ('H.263+') for Decision," International Telecommunication Union, 17 pp. (1997).

Sullivan et al., "The H.264/AVC Advanced Video Coding Standard: Overview and Introduction to the Fidelity Range Extensions," 21 pp. (Aug. 2004).

Tseng et al., "Compatible Video Coding of Stereoscopic Sequences Using MPEG-2's Scalability and Interlaced Structure," *Int'l Workshop on HDTV '94*, Torino, Italy, 10 pp. (1994).

Wiegand, "Joint Model Number 1, Revision 1 (JM1-r1)," JVT-A003r1, 80 pp. (document marked "Generated: Jan. 18, 2002").

Wien et al., "16 Bit Adaptive Block Size Transforms," JVT-C107r1, 54 pp. (document marked "3rd Meeting: Fairfax, Virginia, USA 6-1 May, 2002").

* cited by examiner

INTRA COMPRESSION OF PIXEL BLOCKS USING PREDICTED MEAN

CROSS-REFERENCE TO RELATED APPLICATIONS

This application is a continuation of U.S. patent application Ser. No. 08/850,957, filed May 5, 1997, entitled "INTRA COMPRESSION OF PIXEL BLOCKS USING PREDICTED MEAN"; now U.S. Pat. No. 6,571,016 and is related to U.S. Patent Applications: Ser. No. 08/625,650, filed Mar. 29, 1996, entitled "TABLE-BASED LOW-LEVEL IMAGE CLASSIFICATION AND COMPRESSION SYSTEM" (now U.S. Pat. No. 6,404,923); Ser. No. 08/714,447, filed Sep. 16, 1996, entitled "MULTIMEDIA COMPRESSION SYSTEM WITH ADDITIVE TEMPORAL LAYERS"; Ser. No. 08/818,805, entitled "METHOD AND APPARATUS FOR IMPLEMENTING MOTION DETECTION IN VIDEO COMPRESSION" (abandoned); Ser. No. 08/819,507 entitled "DIGITAL VIDEO SIGNAL ENCODER AND ENCODING METHOD" (now U.S. Pat. No. 6,118,817); Ser. No. 08/818,804, entitled "PRODUCTION OF A VIDEO STREAM WITH SYNCHRONIZED ANNOTATIONS OVER A COMPUTER NETWORK" (now U.S. Pat. No. 6,006,241); Ser. No. 08/819,586, entitled "METHODS AND APPARATUS FOR IMPLEMENTING CONTROL FUNCTIONS IN A STREAMED VIDEO DISPLAY SYSTEM" (now U.S. Pat. No. 6,014,706); Ser. No. 08/818,769, entitled "METHODS AND APPARATUS FOR AUTOMATICALLY DETECTING PROTOCOLS IN A COMPUTER NETWORK" (now U.S. Pat. No. 5,999,979); Ser. No. 08/818,127, entitled "DYNAMIC BANDWIDTH SELECTION FOR EFFICIENT TRANSMISSION OF MULTIMEDIA STREAMS IN A COMPUTER NETWORK" (now U.S. Pat. No. 6,292,834); Ser. No. 08/819,585, entitled "STREAMING AND DISPLAYING A VIDEO STREAM WITH SYNCHRONIZED ANNOTATIONS OVER A COMPUTER NETWORK" (now U.S. Pat. No. 6,173,317); Ser. No. 08/818,644 entitled SELECTIVE RETRANSMISSION FOR EFFICIENT AND RELIABLE STREAMING OF MULTIMEDIA PACKETS IN A COMPUTER NETWORK" (now U.S. Pat. No. 5,918,002); Ser. No. 08/819,579, U.S. Patent Application Publication No. US-2001-0017941-A1, entitled METHOD AND APPARATUS FOR TABLE-BASED COMPRESSION WITH EMBEDDED CODING" (abandoned); Ser. No. 08/822,156, entitled "METHOD AND APPARATUS FOR COMMUNICATION MEDIA COMMANDS AND DATA USING THE HTTP PROTOCOL" (now U.S. Pat. No. 6,128,653); Ser. No. 08/818,826, entitled "DIGITAL VIDEO SIGNAL ENCODER AND ENCODING METHOD" (now U.S. Pat. No. 5,903,673); provisional U.S. Patent Applications: Ser. No. 60/036,661) entitled "VCR-LIKE FUNCTIONS FOR RENDERING VIDEO ON DEMAND (VOD)"; Ser. No. 60/036,662) entitled "METHODS AND APPARTUS FOR AUTODETECTING PROTOCOLS IN A COMPUTER NETWORK"; which are all incorporated herein by reference. U.S. patent application Ser. No. 08/623,299, filed Mar. 28, 1996, entitled "TABLE-BASED COMPRESSION WITH EMBEDDED CODING" (now U.S. Pat. No. 6,215,910) is incorporated herein by reference.

BACKGROUND OF THE INVENTION

1. Field of the Invention

The present invention relates to a method and apparatus for compression of multimedia data. More specifically, the present invention relates to a method and apparatus for predictive compression of video frames.

2. Description of the Related Art

The creation of pictures or images has been a human activity since the beginning of humanity. However, until recent history viewing of an image required the viewer to be physically present at the image. This was geographically cumbersome. Photography, both still and motion, broke this geographic constraint by allowing pictures to be captured and transported independent of the physical images they represented. Television enhanced transmission of images, by sending images, recorded or live, to any geographic location capable of receiving a radio signal. But, for the most part, viewers of television can only view images that are scheduled for transmission, rather than selecting images at will.

With the development of computers, and more specifically computers that are linked across a network, images stored on one computer may be demanded by a viewer, and almost instantaneously provided to the viewer's computer over the computer network. One computer network that is increasingly being used is the Internet, the well-known international computer network that links various military, government, education, nonprofit, industrial and financial institutions, commercial enterprises, and individuals.

Images are typically of two types: 1) single pictures; or 2) moving pictures. Single pictures include photographs, computer art, faxes and web pages. Moving pictures typically include a number of single images or frames organized into a particular sequence. Within a computer network, images are captured and stored on one computer, and then transmitted over the network to another computer for viewing. An example of this is provided in FIG. 1, to which reference is now made.

FIG. 1 illustrates a computer system 100 that includes a server 102 connected to a number of mass storage devices 104. The mass storage devices 104 are used to store a number of video frames 120. The video frames 120 could be still images, or could be combined into sequences to create moving pictures, as described above. The sequences reside on the mass storage devices 104, and upon request, may be transmitted by the server 102 to other computers 108 via a network 106. In addition, the video frames 120 may be transferred to remote computers, such as the computer 112, via a network 116, using a router 110 and/or a modem 114. One skilled in the art should appreciate that the network 116 could be a dedicated connection, or a dial-up connection, and could utilize any of a number of network protocols such as TCP/IP or Client/Server configurations.

In operation, a user sitting at any of the computers 108, 112 would request video frames 120 from the server 102, and the server would retrieve the video frames 120 from the mass storage devices 104, and transmit the frames 120 over the network 106. Upon receipt of the video frames 120, the computers 108, 112 would display the images for the requester.

It should be appreciated that the computers 108, 112 may be positioned physically close to the server 102, or may be thousands of miles away. The computers 108, 112 may be connected to the server 102 via a direct LAN connection such as Ethernet or Token Ring, or may utilize plain old telephone service (POTS), ISDN or ADSL, depending on the availability of each of these services, their cost, and the performance required by the end user. As is typically of computer equipment and services, higher performance means more cost.

In most cases, the amount of data required to represent a video frame, or more specifically a sequence of video frames 120 is significant. For example, a color image or frame is typically represented by a matrix of individual dots or pixels, each having a particular color defined by a combination of red, green and blue intensities (RGB). To create a palette of 16 million colors (i.e., true color), each of the RGB intensities are represented by an 8-bit value. So, for each pixel, 24-bits are required to define a pixel's color. A typical computer monitor has a resolution of 1024 pixels (across) by 768 pixels (down). So, to create a full screen image for a computer requires 1024×768×24 bits=18,874,368 bits, or 2,359,296 bytes of data to be stored. And that is just for one image.

If a moving picture is to be displayed, a sequence of images are grouped, and displayed one after another, at a rate of approximately 30 frames per second. Thus, a 1 second, 256 color, full screen movie could require as much as 60 megabytes of data storage. With present technology, even very expensive storage systems, and high speed networks would be overwhelmed if alternatives were not provided. By way of example, as the resolution and the frame rate requirements of a video increase, the amount of data that is necessary to describe the video also increases.

One alternative to reducing the amount of data required to represent images or moving pictures is to simply reduce the size of frames that are transmitted and displayed. One popular frame size is 320 pixels in width and 240 pixels in height, or 320×240. Thus, a 256 color frame of this size requires 320×240×24=1,843,200 bits, or 230 kilobytes of data. This is significantly less ($1/10^{th}$) than what is required for a full screen image. However, as frames are combined into moving pictures, the amount of data that must be transmitted is still significant.

An additional solution to reducing the amount of storage space required for video frames involves compressing the data. The extent to which data is compressed is typically measured in terms of a compression ratio or a bit rate. The compression ratio is generally the number of bits of an input value divided by the number of bits in the representation of that input value in compressed code. Higher compression ratios are preferred over lower compression ratios. The bit rate is the number of bits per second of compressed data required to properly represent a corresponding input value.

There are three basic methods involved in any data compression scheme: 1) transformation, 2) reduced precision (quantization), and 3) minimization of number of bits (encoding). Each of these methods may be used independently, or may be combined with the other methods to obtain optimum compression. Although the number of scheme combinations is large, typically compression is accomplished by a sequential process of transformation, precision reduction, and coding. Coding is always the final stage of the process, but there are sometimes several transformation and precision reduction iterations. This process is summarized in FIG. 2, to which attention is now directed.

In FIG. 2, a block 202 is shown to illustrate the step of transformation, a block 204 is shown to illustrate the step of quantization, and a block 206 is shown to illustrate the step of coding. The transformation block 202 transforms a data set into another equivalent data set that is in some way smaller than the original. Some transformations reduce the number of data items in a set. Other transformations reduce the numerical size of data items that allow them to be represented with fewer binary digits.

To reduce the number of data items in a set, methods are used that remove redundant information within the set. Examples of such methods include Run-Length-Encoding (RLE) and LZW encoding. RLE is a pattern-recognition scheme that searches for the repetition of identical data values in a list. The data set can be compressed by replacing the repetitive sequence with a single data value and a length value. Compression ratios obtainable from RLE encoding schemes vary depending on the type of data to be encoded, but generally range from 2:1 up to 5:1. LZW encoding replaces repeated sequences within a data set with particular codes that are smaller than the data they represent. Codebooks are used during encoding and decoding to transform the data set back and forth from raw data to encoded data. Compression ratios for video images range from 2:1 to 9:1.

Transformations that reduce the size of individual data items within a data set includes Differencing. Differencing is a scheme that attempts to reduce the size of individual data values within a data set by storing the difference between pixels values, rather than the actual data values for each pixel. In many cases the difference value is much smaller in magnitude than the original data value, and thus requires a smaller data space for storage.

Other transformation schemes exist to transform a set of data values from one system of measurement into another, where the properties of the new data set facilitate the data's compression. One such scheme called colorspace conversion transforms the RGB pixel values into luminance Y, and chrominance $C_b$ and $C_r$ values. This is referred to as RGB/YUV conversion. Less important values, such as the $C_r$ component may be ignored without significantly affecting the image perceived by a viewer.

Another scheme that transforms a set of data values from one system of measurement into another is the Discrete-Cosine-Transform. The DCT transforms a block of original data that typically represents color intensity (YUV) into a new set of values that represent cosine frequencies over the original block of data. Lower frequencies are stored in an upper left portion of the data block with higher frequencies stored in the rest of the block. If higher frequency components are ignored, an entire block of data may be represented by just a few data values in a block.

It should be appreciated that each of the schemes described above are well known in the art, and may be combined, for a particular frame of data, to achieve maximum compression. However, each of these schemes are applied to a single video frame, called intra-frame compression, which is independent of other video frames. For full motion video, including multicast video, teleconferencing, and interactive video, compressing each video frame separately is not sufficient, because of the large number of frames in even a short video sequence. Further compression may be achieved by taking advantage of the similarities between frames. In many instances, the difference between one frame and the next is small because of the short time interval between frames. These schemes are referred to as inter-frame compression.

One simple scheme stores only the pixels that actually change from one frame of the video sequence to the next. Said in a technical way, the scheme is to store only the pixels that produce a nonzero difference when subtracted from their corresponding pixels in a previous frame. Thus, rather than having to transmit all of the pixel values in a video block, only those pixels that have changed need to be transmitted.

Another approach to video compression is to calculate the differences between corresponding pixels in consecutive frames and then encode the differences instead of the original values. This is called motion compensation. But, in motion pictures, pixel values often shift their spatial location from one frame to the next. To locate shifted pixels, a number of pixel values are grouped together to form a block. Then, a block within a present frame is compared to blocks in a previous frame to determine an offset such that all of the pixel differences are minimized. This is called motion estimation. An offset is typically represented as a pair of numbers that specify a shift in the horizontal and vertical directions. This is referred to as a motion vector. If a motion vector can be determined for a particular block, that block may be encoded simply by supplying the motion vector, rather than by encoding the entire block.

With each of the above transformation schemes, reduced precision may be used to further compress data, as shown by block 204. As was mentioned above, one of the chrominance values, $C_r$, could be ignored without significantly affecting the quality of the image. In addition, after performing a DCT transform, higher frequency components can be ignored. Furthermore, by calculating differences between pixel values, and ignoring minor differences, further compression may be achieved. This illustrates the repetition between the transformation block 202 and quantization block 204 of FIG. 2.

The third block shown in FIG. 2 is the Code block 206. This block encodes a data set to minimize the # of bits required per data item. The coding process assigns a unique code value to data items in a set. One coding scheme that is used in compressing video frames is Huffman coding. Huffman codes assign a variable-length code to each possible data item, such that the values that occur most often in the data set have smaller length codes while the values that occur less frequently have longer-length codes. Huffman coding creates a tree structure where the leaf nodes are the original probabilities associated with each data value from the data set. Each branch in the tree is labeled with a one or a zero. The Huffman code assigned to each original data value is the set of labels along a path from the root node to the associated leaf node.

The above provides a general overview of a number of different compression schemes for compressing video frames prior to transmitting the frames over a network to a remote computer. It should be appreciated that specific implementation of any of these schemes, or more accurately, a combination of particular ones of these schemes, requires significant preprocessing (encoding) of the video frames prior to transmission, as well as post processing (decoding) of the frames.

As the complexity that is associated with compression and decompression increases, the efficiency with which video frames may be encoded and decoded drops. Stated another way, higher compression ratios require more processing, and take longer to encode/decode than do lower compression ratios. However, higher compression ratios allow more data to be delivered over a network in less time. Therefore, a tradeoff is generally made between obtaining a particular compression ratio, and obtaining a satisfactory bit rate of transfer. If a high compression ratio takes too long to decode, viewed images will appear choppy or disjunct. If an inadequate bit rate is obtained, a viewer will be kept waiting for the image, or the image will replay in slow motion.

SUMMARY OF THE INVENTION

What is needed is an apparatus and method that improves the efficiency of encoding/decoding video frames while maintaining a desired bit rate for a given resolution. More specifically, what is needed is an apparatus and method that incorporates several forms of motion estimation, and selects the best form for each block of data to be encoded.

Accordingly, it is a feature of the present invention to provide a method to encode a video frame that is transmitted over a communications medium. The method includes: 1) obtaining a video frame; 2) separating the frame into blocks; 3) encoding a plurality of blocks using inter compression; 4) encoding the plurality of blocks using predictive intra compression; and 5) selecting better block compression between the inter and predictive intra compression; wherein the steps of encoding the plurality of blocks is performed on a block by block basis, to provide optimum compression of the video frame for a given bit rate.

DESCRIPTION OF THE DRAWINGS

These and other objects, features, and advantages of the present invention will become better understood with regard to the following description, and accompanying drawings where:

FIG. 12B is a block diagram of a macroblock that is divided into smaller blocks according to the segmentation process of FIG. 12a.

FIG. 12c is an encoding map tree illustrating segmentation of a block according to the segmentation process of FIG. 12a.

DETAILED DESCRIPTION OF THE INVENTION

The present invention provides a complex but efficient method and apparatus for compressing/decompressing video information that is distributed over a computer network. However, before discussing the detailed portions of the invention, a general overview will be provided.

Figure 3:
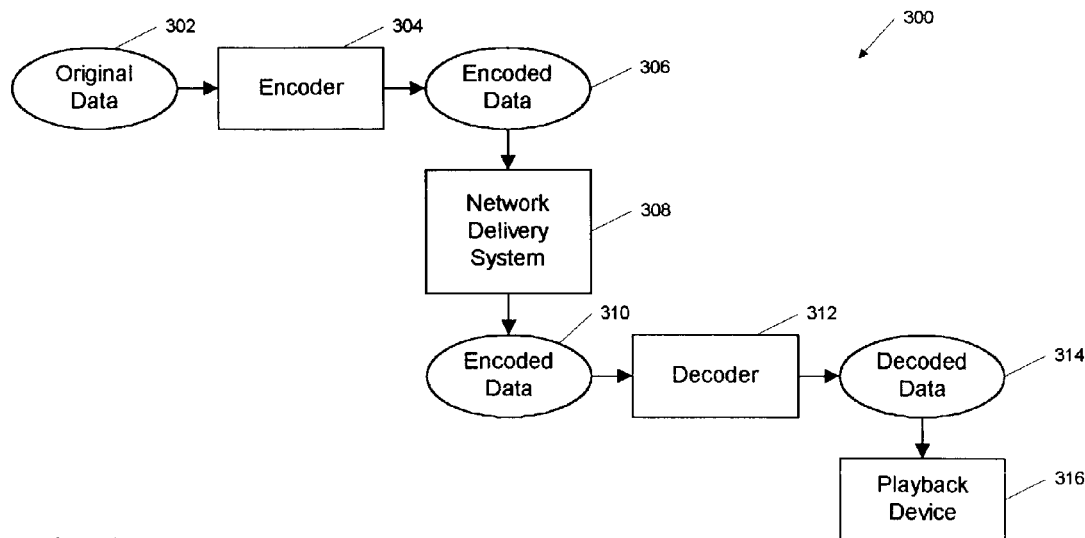
FIG. 3 is a related art block diagram illustrating encoding, delivery and decoding of video images.

Referring to FIG. 3, a block diagram 300 of a data encoder/decoder system is shown. The system 300 includes original data 302, or data that is generally unencoded. The original data 302 may be a sequence of video frames, as described above, having a resolution of 320×240 pixels, and a color palette of 256 colors. The original data 302 is provided to an encoder 304 that encodes or compresses the data 302, and provides encoded data 306 as output. Although any suitable compression method may be used compress the original data 302, a preferred method includes that described in U.S. patent application Ser. No. 08/623,299 referenced above.

The encoded data 306 is provided to a network delivery system 308 that accepts the encoded data 306 and generates as output encoded data 310. Typically, the network delivery system 308 is used to send encoded data 306 from one computer system on the network to another computer. The channels of communication used by the network delivery system 308 include LAN's, POTS, ISDN and ADSL.

Encoded data 310 is typically a formatted, or streamed, version of the encoded data 306. As the encoded data 306 is streamed, it can be delivered for such applications as video-conferencing and interactive on-demand video.

Figure 1:
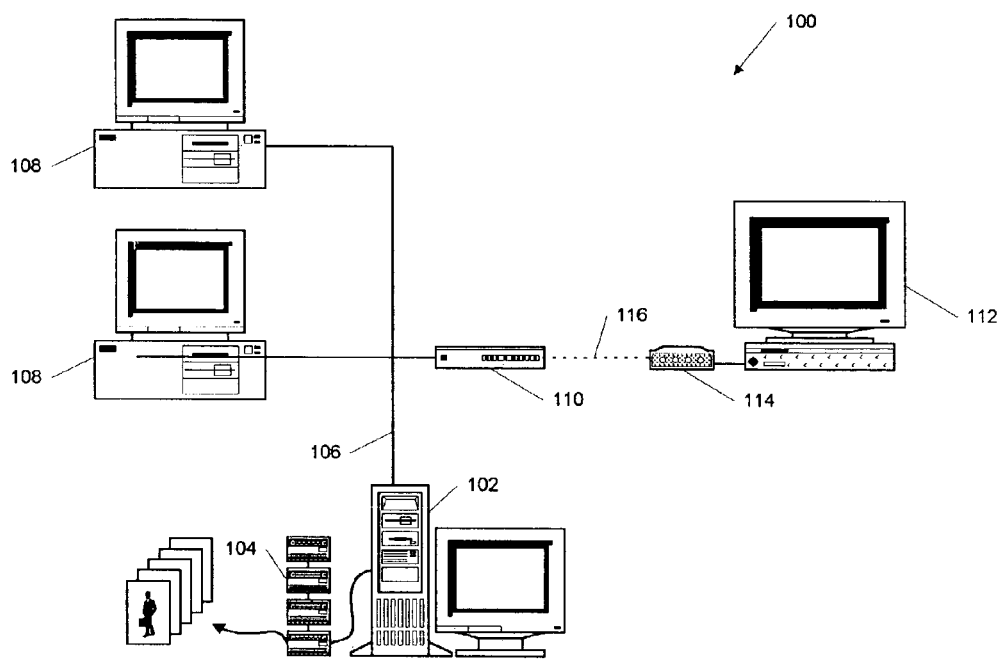
FIG. 1 is block diagram of a prior art computer network for encoding, transmission and decoding of video images.
Figure 2:
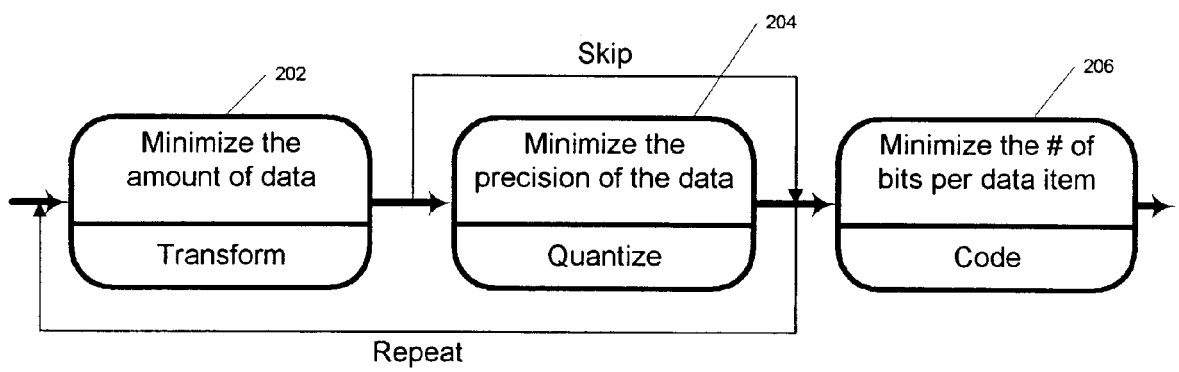
FIG. 2 is a prior art block diagram of encoding methodology for video images.

The encoded data 310 is provided to a decoder 312 that decodes the encoded data 310 and provides decoded data 314 as output. It should be understood that the decoder 312 performs an inverse operation, corresponding to the type of encoding performed by the encoder 304. It should also be understood that the encoder 304 and the decoder 312 are typically a personal computer, or a network computer, executing compression/decompression routines, as illustrated above in FIG. 1.

Once the decoded data 314 is generated, it is forwarded to a playback device 316. The playback device 316 is typically a video controller and computer monitor attached to a computer.

Figure 4A:
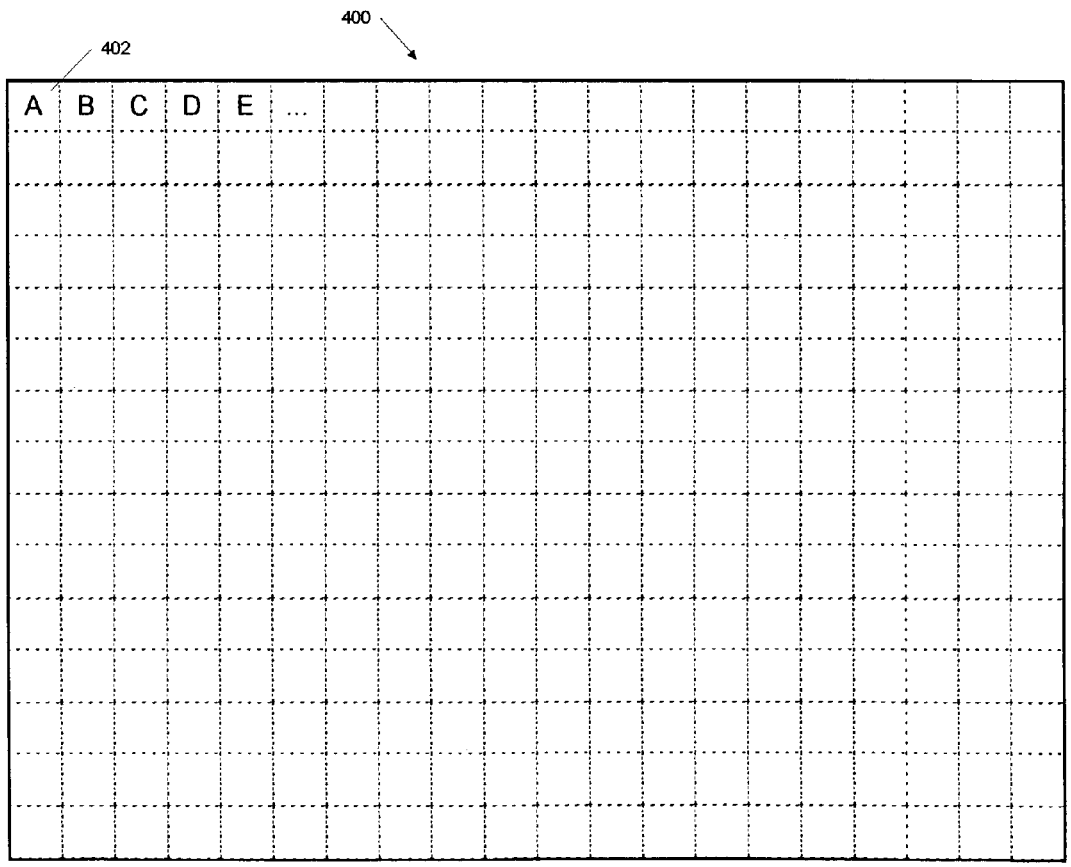
FIGS. 4a and 4b illustrate a video frame divided into a number of macroblocks, and a macroblock divided into a number of blocks, each block having a number of different pixels.

Now referring to FIG. 4a, a video frame 400 is shown. The video frame 400 is representative of one of the 320×240 pixel frames that is encoded/decoded by the method and apparatus of the present invention. The video frame 400 includes a plurality of macroblocks 402 designated as A, B, C, D, E, etc. In one embodiment, the macroblocks 402 are 16×16 pixels in dimension, and the video frame 400 has 20 macroblocks across and 15 macroblocks down. The video frame 400 is compressed a macroblock at a time, starting at the upper left corner of the video frame 400, and proceeding in a raster fashion to the lower right macroblock. Encoding/decoding of the macroblocks will be discussed further below with reference to FIG. 5.

Figure 4B:
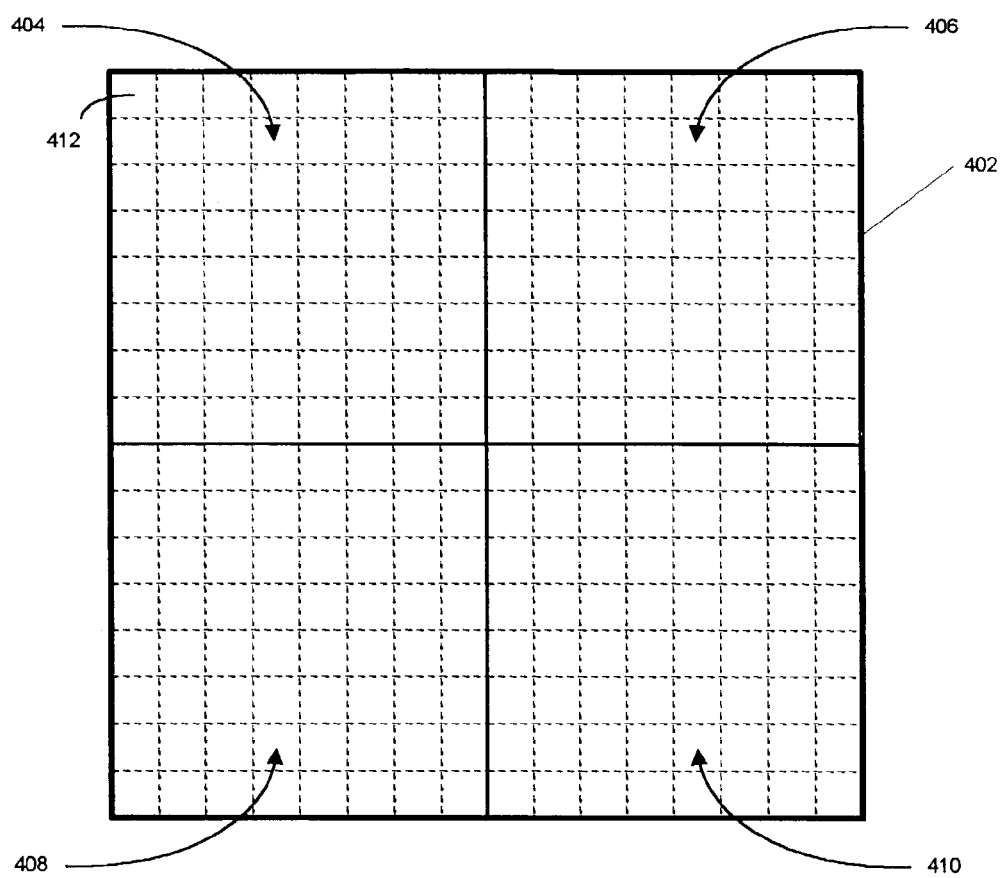

Now referring to FIG. 4b, one of the macroblocks 402 is shown. The macroblock 402 includes individual pixels 412, each of which contain color information. In one embodiment, the original data for each pixel 412 includes data for each RGB component. The macroblock 402 is 16 pixels 412 in width, and 16 pixels 412 in height. As will be further discussed below, encoding/decoding of the macroblock 402 may be performed on the macroblock 402 as a whole, or the macroblock 402 may be broken into smaller blocks for encoding. In one embodiment, the macroblock 402 may be broken into 4 distinct blocks 404, 406, 408, and 410, each of which are 8×8 pixels in dimension.

Having provided a general overview of the environment in which the present invention operates, as well as a graphical representation of a video frame, a global perspective of the encoding/decoding process according to the present invention will be provided. After the general perspective is provided, a detailed description of the encoding/decoding follows.

Figure 5:
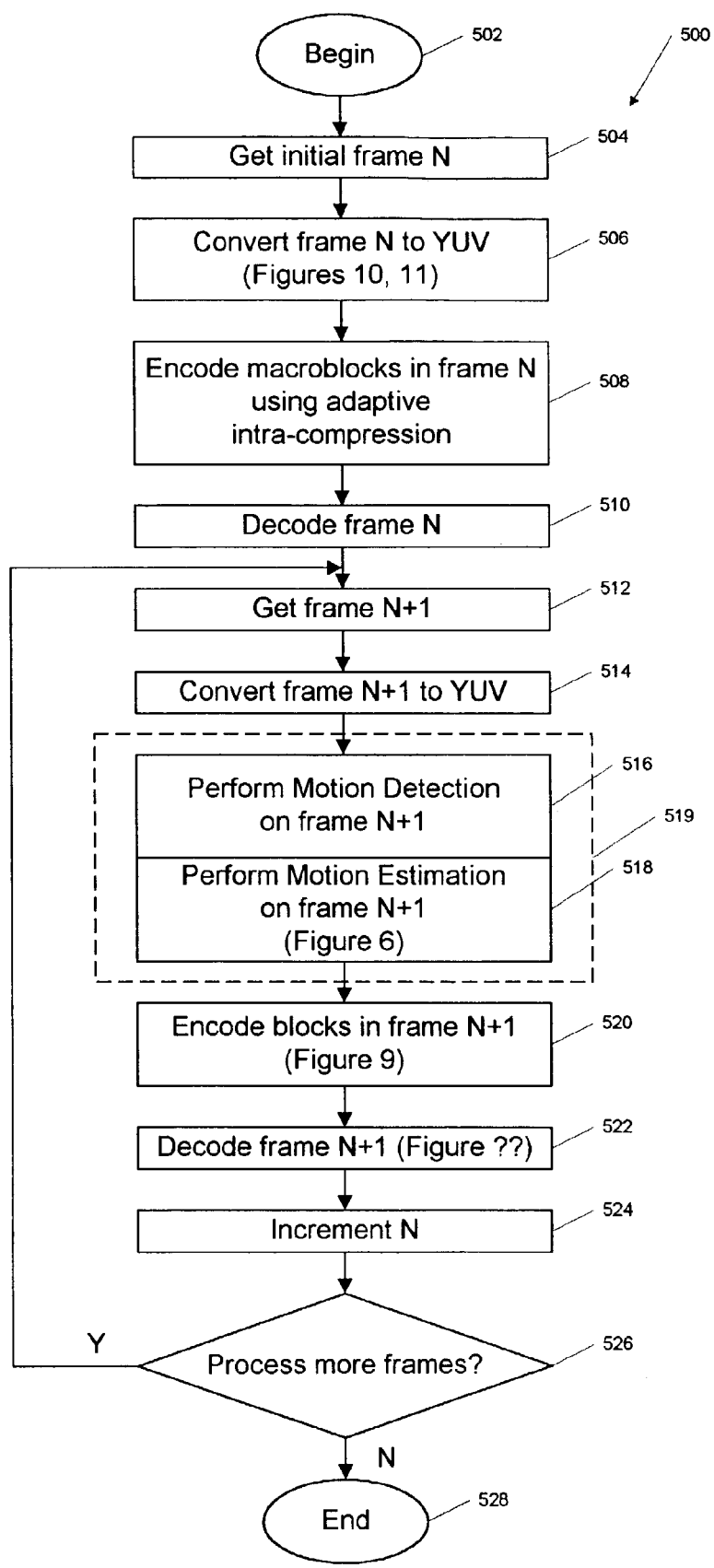
FIG. 5 is a process flow chart illustrating a process of encoding a video frame according to the present invention.

Now referring to FIG. 5, a flow chart 500 is shown that illustrates encoding of a video frame 400 according to the present invention.

The process 500 begins at step 502, and in step 504, an initial frame N is obtained. The initial frame N may be of any suitable format, as for example an RGB format. It should be appreciated that the initial frame N is the first of a series of frames that is to be encoded, and therefore is typically encoded completely to provide a basis of comparison for subsequent frames that are to be encoded. Process flow then proceeds to step 506.

Figure 10A:
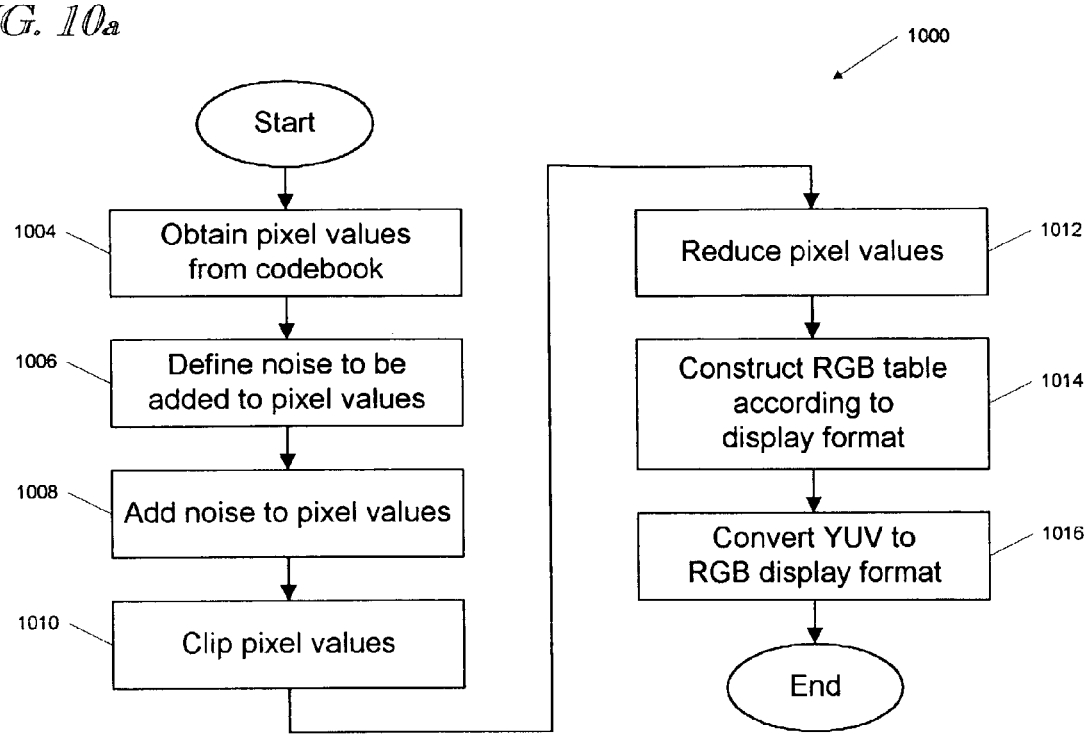
FIG. 10a is a process flow diagram that illustrates the steps associated with preprocessing a codebook that is used with a color transformation of bits encoded using motion compensation according to the present invention.

At step 506 the initial frame N is converted from colorspace, e.g., an RGB format, into a luminance and chrominance format using any suitable method. In the described embodiment, the luminance and chrominance format is a YUV-411 format. The YUV-411 format is a format in which the Y-component relates to the perceived intensity of an image derived from the RGB amplitudes, and the chrominance components relates to the perceived color of the image. Conversion from colorspace to YUV format is well known in the art. However, a description of an inverse conversion process from YUV to RGB, according to the present invention, is provided below with reference to FIGS. 10 and 11. Process then proceeds to step 508.

At step 508 the macroblocks in frame N are encoded using intra-dependent compression. Intra-dependent compression, or "intra" compression, involves compressing a frame based only on information provided in that frame, and is not dependent on the encoding of other frames. As previously mentioned, due to the fact that the initial frame provides an initial condition for subsequent frames that are to be encoded, every macroblock of the initial frame is generally encoded. In the described embodiment, tables generated from codebooks are used to encode the blocks. For a description of the encoding scheme used on frame N, reference is made to U.S. patent application Ser. No. 08/819,579, Publication No. US-2001-0017941-A1, entitled "METHOD AND APPARATUS FOR TABLE-BASED COMPRESSION WITH EMBEDDED CODING" (abandoned). After the macroblocks in the intial frame are encoded, process flow proceeds to step 510.

At step 510, the initial frame N is decoded using intra-dependent, or intra, techniques, as the initial frame was originally encoded using intra compression. The initial frame N is decoded to provide a reconstructed initial frame that may be used as a basis for encoding subsequent frames. After the reconstructed initial frame is obtained from the decoding process in step 510, process flow proceeds to step 512.

At step 512 a subsequent frame N+1 is obtained. In general, frame N+1 and the initial frame N are of the same colorspace format. Flow proceeds to step 514.

At step 514 frame N+1 is converted into a luminance and chrominance format, e.g., a YUV-411 format. Flow proceeds to step 516.

At step 516, after frame N is converted into a YUV-411 format, a motion detection algorithm may be used to determine the manner in which frame N+1 is to be encoded. Any suitable motion detection algorithm may be used. One particularly suitable motion detection algorithm determines whether there has been any movement between a block in a given spatial location in a subsequent frame, and a block in that same spatial location in a previous reconstructed frame. Such an algorithm is described in co-pending U.S. patent application Ser. No. 08/818,805 (abandoned). Flow then proceeds to step 518.

At step 518 a motion estimation algorithm is used to encode frame N+1. One example of a motion estimation algorithm that may be used is described in above-referenced co-pending U.S. patent application Ser. No. 08/623,299. In that motion estimation algorithm, a best match block in a previous reconstructed frame is found for a given block in a subsequent frame. A motion vector that characterizes the distance between the best match block and the given block is then determined, and a residual, which is a pixel-by-pixel difference between the best match block and the given block, is calculated. It should be appreciated that the motion detection step and the motion estimation step, i.e., steps 516 and 518, may comprise an overall motion analysis step 519, as either or both the motion detection step and the motion estimation step may be executed. Upon completion of step 519, all blocks within frame N+1 have been compressed, as needed. A description of this process if provided below with reference to FIG. 6. Flow then proceeds to step 520.

At step 520, the blocks in frame N+1 are encoded. The blocks may be encoded using either intra compression, as described above in step 508, or inter compression. In one embodiment, inter compression may involve the use of tables generated from codebooks, as described in co-pending U.S. patent application Ser. No. 08/623,299. For a more complete description, reference is made to FIG. 9 below. Flow then proceeds to step 522.

At step 522 the frame N+1 is decoded. Frame N+1 is decoded to provide a reconstructed frame upon which future motion estimation calculations for subsequent frames may be based. Flow then proceeds to step 524

At step 524 N is incremented to go to the next frame in the sequence. Flow then proceeds to step 526.

At step 526 a determination is made as to whether there are more frames to process, i.e., whether there are more frames to encode. If the determination is that there are more frames to encode, process flow returns to step 512. If a determination is made that no frames remain to be encoded, then flow proceeds to step 528 where the process of encoding frames is complete.

In summary, an initial frame in a sequence is converted from colorspace to YUV format, and compressed using intra-compression techniques. The initial frame is then decoded to provide a reference frame. The next frame in the sequence is retrieved and converted to YUV format. Motion Detection and Motion Estimation is performed on the next frame, using the initial frame as a reference. Blocks on the next frame are then encoded, and the frame is then decoded to be used as a reference for future frames. The process continues until all frames in the sequence have been encoded.

The majority of systems that encode with motion information use a block-based approach. More specifically, frames are first divided into blocks, and then motion between blocks in consecutive frames is determined. For ease of illustration, macroblocks of size 16×16 will be used to determine motion. However, as will be discussed further below, with reference to FIG. 12, macroblocks may be segmented into smaller blocks to obtain better compression.

With the overview provided by FIG. 5, specific information on the Motion Compensation of step 519 will now be given.

Figure 6A:
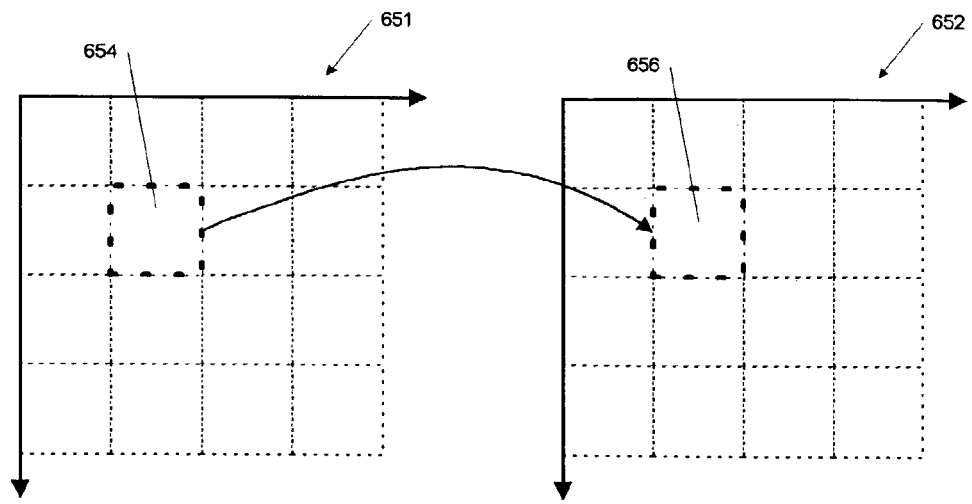
FIG. 6a illustrates a comparison of two macroblocks in the same spatial location, but in two separate video frames.
Figure 6B:
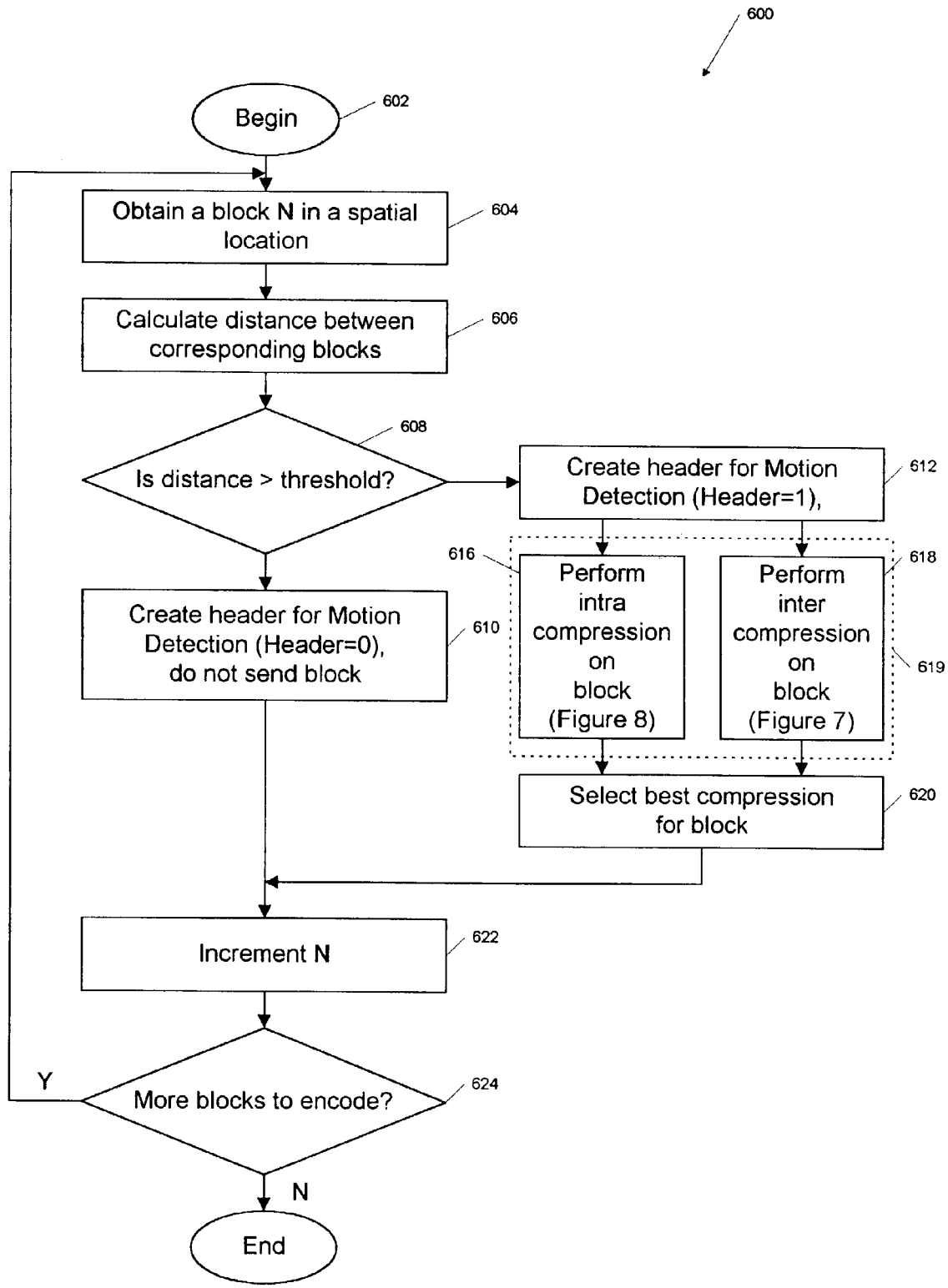
FIG. 6b is a flow chart illustrating motion compensation according to the present invention.

In FIG. 6a, a portion of two frames 651 and 652 are shown. Both of the frames 651 and 652 are similar to that described above with reference to FIG. 4a. Within the frames 651 and 652 are a number of macroblocks 654 and 656, similar to those described above with reference to FIG. 4b. In one embodiment, the frames 651 and 652 are 320×240 pixels in dimension, and the macroblocks 654 and 656 are 16×16 pixels each. In FIG. 6b, a flow chart 600 is shown that illustrates the steps required to perform the Motion Compensation function described by block 519 of FIG. 5.

Motion Compensation begins at step 602, and flow proceeds to step 604. At step 604, a block N is obtained in a spatial location 656 within the frame 652. In addition, a corresponding block 654 located in the same spatial location in a previous frame 651 is obtained. That is, blocks 654 and 656 are obtained from a previous reconstructed frame and a new original frame. In this illustration, the frames 651 and 652 are consecutive frames, but those skilled in the art should appreciate that the frames need not necessarily be consecutive. Flow then proceeds to step 606.

At step 606, the distance is calculated between the corresponding blocks 656 and 654. In Motion Compensation, the term distance refers to the quantitative pixel differences between two blocks. The distance between blocks 656 and 654 may be calculated using a squared error comparison of all of the pixels in the blocks. One method for calculating the distance between corresponding blocks is described in above referenced U.S. Patent Application Ser. No. 08/819,507 (now U.S. Pat. No. 6,118,817). Once the distance is calculated, flow proceeds to decision step 608.

At step 608, a determination is made as to whether the calculated distance is greater than a specified threshold. In other words, a threshold is chosen to allow minor visual differences between blocks to be ignored, while more significant visual differences are handled. If it is determined that the distance between the blocks 656 and 654 is less than the threshold, flow proceeds to step 610. Otherwise flow proceeds to step 612.

At step 610, a header for Motion Compensation is created for the block 656 to indicate that the block 656 will not be transmitted. Since the distance between the block 656 and the previous block 654 does not exceed the threshold, the block 656 is considered to be substantially the same as block 654. Therefore, block 656 does not need to be transmitted. Rather, it can be formed from the previously transmitted block 654. Although any suitable header may be used, in the described embodiment, the header for Motion Detection is set to zero, indicating that block 656 has not been compressed, and will not been transmitted. Flow then proceeds to step 622.

If however, the distance between the blocks 656 and 654 is greater than the threshold, flow proceeds to step 612 where a header for Motion Compensation is created that indicates that block 656 will be compressed for transmission. In the described embodiment, a header value of one is used to indicate that a new block is compressed. Flow then proceeds to step 619.

Step 619 performs at least two separate functions, the first relating to frame compression exclusive of other frames, i.e., intra compression, and the second relating to frame compression that takes advantage of previous frames, i.e., inter compression. It should be appreciated that the current block is being compressed because it is visually distinct from the previous block. The first function, step 616, performs intra compression on the current block. One method of intra compression utilizes the adaptive compression mechanism described in U.S. patent application Ser. No. 08/623,299. An alternative method and apparatus for performing intra compression on the current block will be described below with reference to FIG. 8.

In addition, at step 619, the second function that is performed for the current block is inter compression 618. Inter compression will be further described below with reference to FIG. 7. The result of step 619 is that at least two, if not three different compressions are performed for the current block. The first is an intra compression on the block. The second and third are generated by the inter compression block 618. Upon completion of step 619, flow proceeds to step 620.

At step 620, a comparison is made between the three compressed blocks to determine which compression method performed the best for the current block. The block that had the best compression is selected, and flow proceeds to step 622.

At step 622, the value of N is incremented to select the next block within the frame 652 for compression. Flow then proceeds to decision step 624.

At step 624, a determination is made as to whether any more blocks within the frame 652 require compression. If so, then flow proceeds back to step 604 where the next block is retrieved. If not, then compression for frame 652 ends.

Although the process 600 for Motion Compensation was described with reference to macroblock 656, it should be understood that process 600 is performed for each macroblock within a frame, starting at the upper left macroblock, and proceeding in a raster fashion to the lower right macroblock. Furthermore, as mentioned above, macroblocks may be segmented, as described further below with reference to FIGS. 12a–d, into smaller blocks for better compression.

Figure 7A:
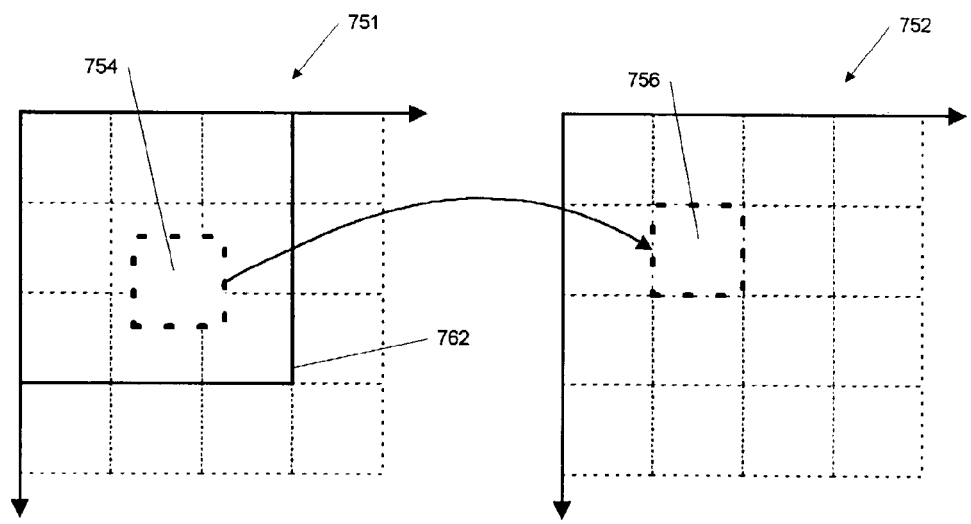
FIG. 7a illustrates a comparison of two macroblocks in different spatial locations, in two separate video frames.
Figure 7B:
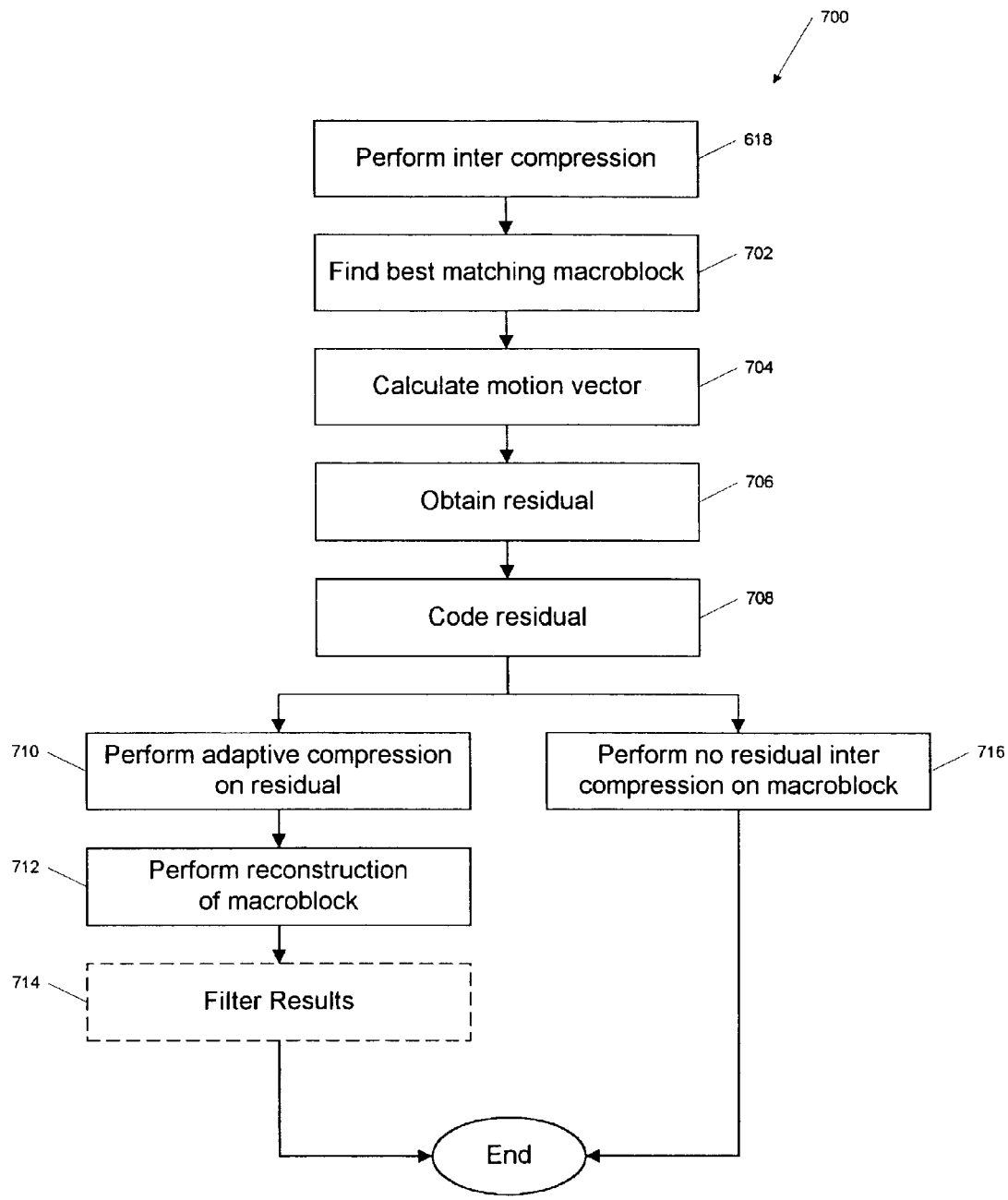
FIG. 7b is a flow chart illustrating motion detection according to the present invention.

Now referring to FIGS. 7a and 7b, Motion Estimation according to the present invention will be now described. Since most video sequences deal with moving pictures, it should be assumed that pixel values shift in position from one frame to the next. Locating the shift in position, of a block, is called Motion Estimation.

FIG. 7a includes portions of a previously encoded frame 751 and a current frame 752. Each of the frames 751 and 752 have a number of macroblocks, including macroblocks 754 and 756, respectively. FIGS. 6a and 6b illustrated a sequence for determining whether a current macroblock was approximately the same as a previously encoded block in the same spatial location. If it was, then a header was created to indicate that the block did not need to be compressed. However, if it was visually different, then the better of inter compression or intra compression was performed on the current block.

In addition, Motion Estimation is performed. In Motion estimation, a search for block 756 begins within frame 751 to locate a block that best matches block 756 in frame 752. A best match is a block that provides the minimum distances, as described above in FIG. 6b.

An area 762 is defined around the previously encoded block 754 to limit the block search within frame 751. Although it is possible to search the entire frame 751 for a best match to block 756, it is not practical. Processing overhead for entire frame comparisons would be too time consuming to perform for every current block that exceeds the difference threshold. Furthermore, if the frames used for comparison are consecutive, or close in proximity, it would be highly unusual to have an abrupt shift in block locations between consecutive frames. Therefore, the area 762 is chosen to optimize processing, while still insuring that a best match can be found. In one embodiment, the search area 762 is defined by edges that are offset twenty-four pixels from the origin or center of block 754 of frame 751. In an alternative embodiment, where matches are sought for blocks that are smaller than 16×16, a smaller search area may be used.

If a best match is found for block 756, then a motion vector is calculated that establishes the horizontal and vertical pixel offset from the previously encoded block 754. The motion vector is then transmitted in place of the current block.

Motion Compensation further involves the calculation of a residual. A residual is the result of a pixel by pixel subtraction between the current block and the best block representation from the previous frame.

More specifically, Motion Estimation begins at step 618. Flow proceeds to step 702 where the best matching macroblock within a reconstructed previous frame is determined. Flow then proceeds to step 704.

At step 704, the motion vector corresponding to the best matching macroblock is calculated. Flow then proceeds to step 706.

At step 706, the residual is calculated by subtracting the best matching block in the reconstructed previous frame from the current macroblock. Flow then proceeds to step 708.

At step 708, the residual is coded. This is performed in one of two paths. The first path, proceeds down to step 716 where the residual is coded with all 0's, indicating very little difference between the current macroblock and the previous reconstructed frame. In this instances, a motion vector will be transmitted, but the residual used by the decoder will be 0's.

The second path begins at step 710 where the residual is coded using the adaptive compression encoder referenced above in U.S. patent application Ser. No. 08/623,299. Flow then proceeds to step 712.

At step 712, the current macroblock is reconstructed using any suitable method. Flow then proceeds to optional step 714.

At step 714, the reconstructed macroblock may be filtered to reduce noise. It should be appreciated that any suitable filter, as for example a median filter, may be implemented. At this point, inter compression of a macroblock is complete.

Reference is now directed back to FIG. 6b. If a current block had a distance that exceeded a specified threshold, three different compressions were performed. The last two related to inter compression, which produced an inter compressed block, and a reconstructed adaptively compressed residual. The third compression produced was an intra compressed block, without regard to previously encoded frames.

Figure 8A:
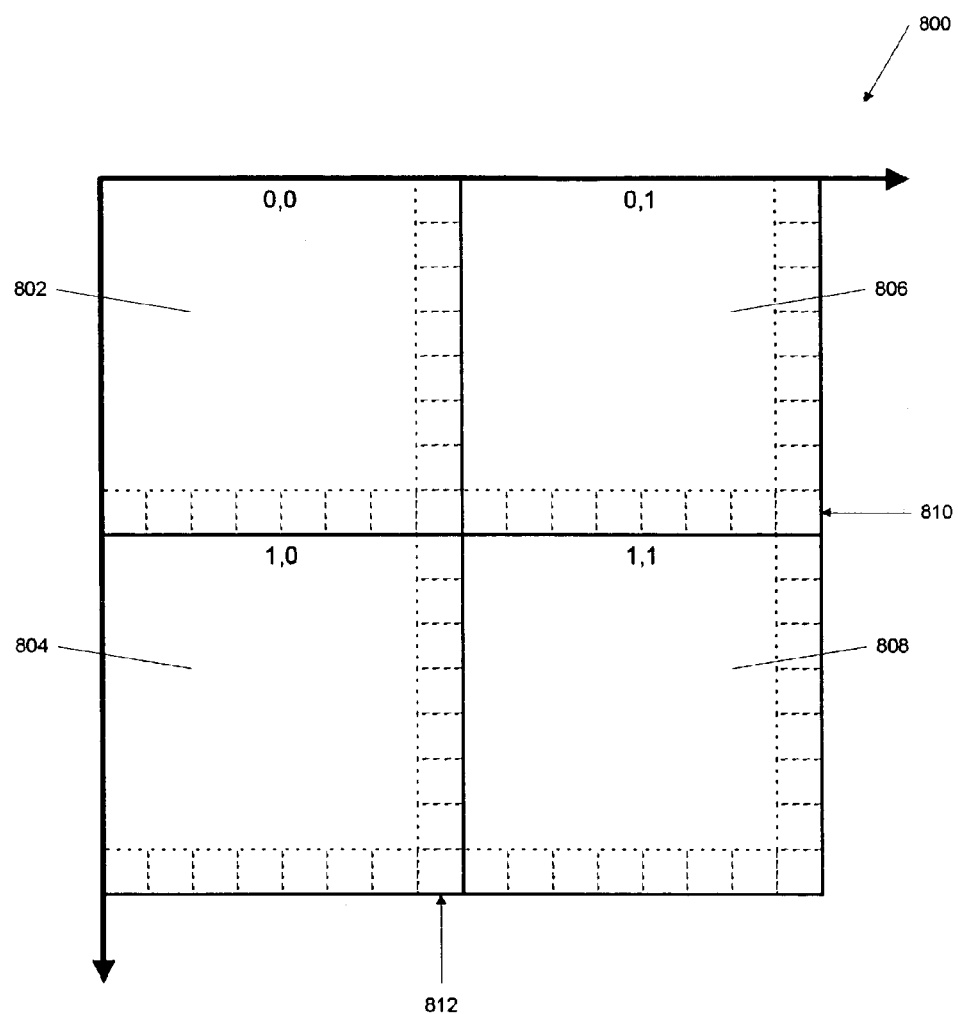
FIGS. 8a and 8b illustrate predicted mean intra block compression according to the present invention.

An alternative embodiment of the intra compression scheme referenced by step 616 of FIG. 6 will now be described with reference to FIGS. 8*a* and 8*b*. FIG. 8*a* includes a macroblock 800 within a frame N. The macroblock 800 includes four blocks 802, 804, 806 and 808, each having a dimension of 8×8 pixels. Also shown are bottom pixel locations 810, and right pixel locations 812 within each of the blocks 802–808. In this illustration, each of the blocks 802–808 has 8 bottom pixels, and 8 right pixels. The bottom pixels 810 and the right pixels 812 are used for intra compression of blocks 802–808 as will now be described with reference to FIG. 8*b*.

Figure 8B:
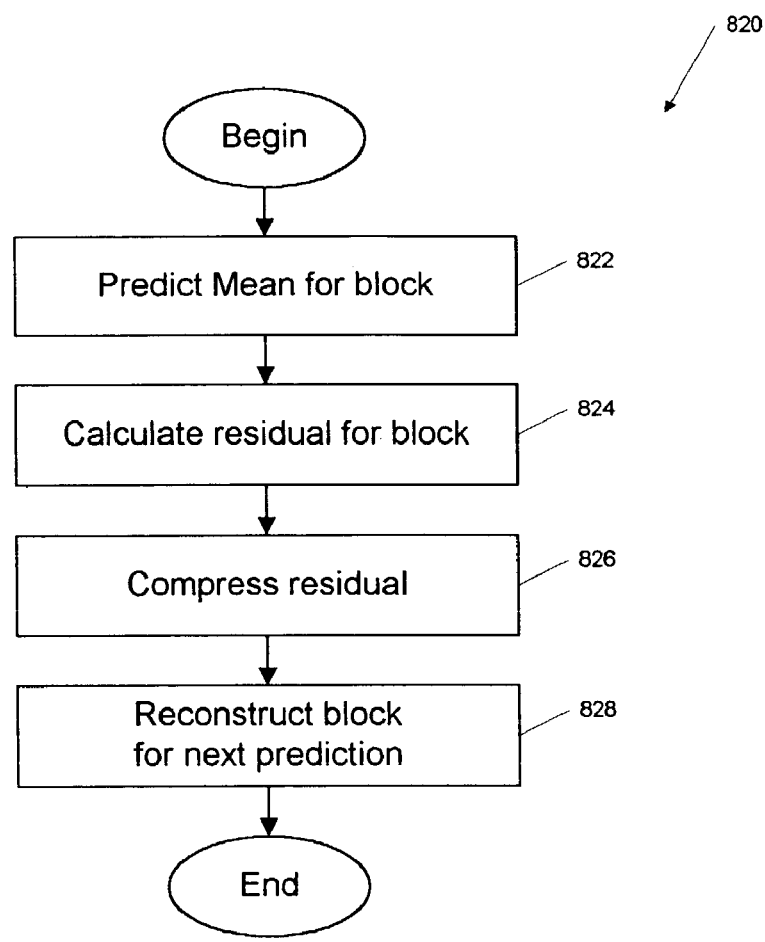

In FIG. 8*b*, a flow chart 820 is shown that illustrates predictive intra compression of blocks within a frame N, particularly compression of block 808. Compression begins at step 822.

At step 822, a mean value is predicted for block 808. The Mean value is determined by utilizing the right most pixels 812 within block 804 that are adjacent to block 808, and the bottom most pixels 810 within block 806 that are adjacent to block 808. A Mean is calculated from these 16 pixels, and used as a predicted mean for all of the pixel locations within block 808.

In an alternative embodiment, training sequences can be developed from the adjacent pixel values to optimize the prediction. For example, a Wiener-Hopf linear predictor may be used to calculate individual pixel values for the block 808. An important aspect is that pixel values in proximity to the block to be compressed are used to predict pixel values within the block. Once the pixel values within block 808 have been calculated, flow proceeds to step 824.

At step 824, a residual is calculated for block 808. The residual is determined by subtracting the predicted pixel values (the Mean) from the actual pixel values in pixel 808. Flow then proceeds to step 826.

At step 826, the residual for block 808 is compressed using the adaptive HVQ scheme referenced above in U.S. patent application Ser. No. 08/623,299. By using a residual for block 808, and by taking advantage of the spatial correlation between block 808 and the surrounding blocks, clustering of pixel values for block 808 occurs. This allows for better compression than simply encoding block 808. The compressed residual is then provided to step 620 in FIG. 6 for selection. Flow then proceeds to step 828.

At step 828, the block 808 is reconstructed from the compressed residual to be used for calculation of the predicted mean of following blocks in the frame N. After reconstruction of the block 808, process 820 is complete.

It should be appreciated that process 820 is repeated for each block within a frame that requires compression. Thus, for each block within a frame, pixel values in the blocks to the left, and on top of the block to be compressed are used to predict the pixel values for the block. However, for the top row of blocks, only the pixels in the block to the left of the block to be compressed may be used for prediction. Similarly, for the left column of blocks, only the pixels in the block on top of the block to be compressed may be used for prediction. And, to begin the predictive process, Gray is used to predict the pixel values for the top left block in the frame.

Referring again to FIGS. 5 and 6*b*, after a selection is made between the intra compressed block, the inter compressed block, and the no residual inter compressed block, at step 620, the blocks in the frame N+1 are encoded, at step 520. More specifically, a block type is written to identify which of the three compression schemes were used to compress each of the blocks in the frame, as needed. In addition, tree bits that identify how the block was coded, along with codeword indices are written. The indices are generally used in codebook look-ups to decode the encoded blocks, as described in above referenced U.S. patent application Ser. No. 08/623,299. In one embodiment, the indices are encoded using a Huffman encoder, although any suitable method may be used to encode the indices.

If the blocks have been encoded using inter compression, then motion vector bits are generally obtained through the use of a Huffman encoder. Furthermore, Motion Detection bits that indicate if a block has been compressed are also written. After these bits are written, the process of encoding a frame is complete.

Huffman coding is often used to encode motion vectors, as well as indices. Huffman coding serves to reduce the number of bits in compressed data without incurring additional losses. Typically, with Huffman coding, symbols, characters or values, that are most likely to appear in data are encoded with fewer bits than symbols which are less likely to appear. In general, a Huffman encoder uses look-up tables to map input symbols to bits, as is well known to those skilled in the art. Once a Huffman encoder is used to compress bits, a Huffman decoder is typically used to decompress the compressed bits.

Figure 9A:
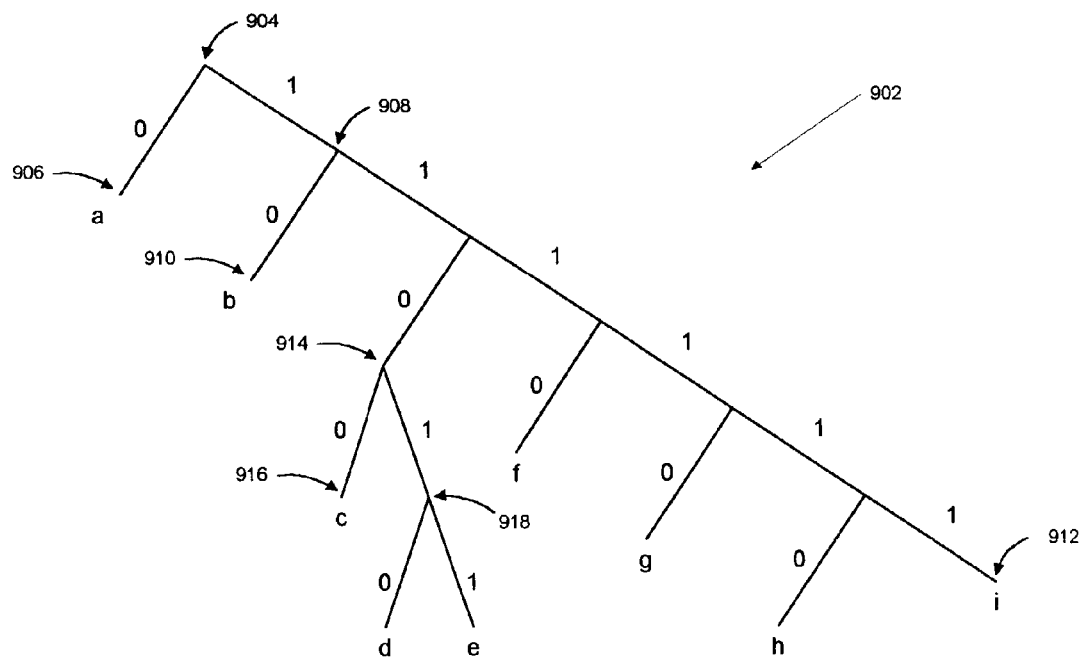
FIG. 9a is a tree representation of a classic Huffman decoder.
Figure 9B:
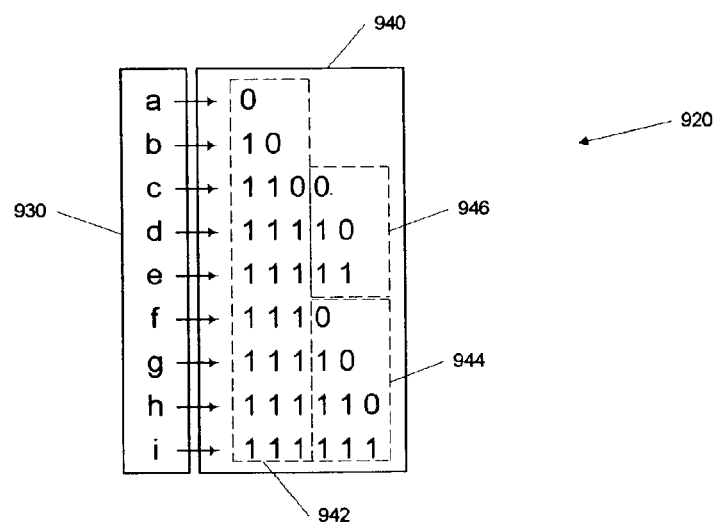
FIG. 9b is a table used with a two-stage Huffman decoder according to the present invention.

With reference to FIG. 9*a*, a classic state-based Huffman decoder will be described. A binary mapping tree 902 is used to map bits to an appropriate symbol, and includes a root 904 which, as shown, may be associated either with a "O" bit or a "1" bit. If the first bit that is to be decoded is read in as "O", then the bits are mapped to leaf 906 corresponding to the "a" symbol. As such, bit "O" is decoded as the "a" symbol.

If the first bit that is to be decoded is read in as "1", then the next bit to be decoded is obtained, and tree 902 is traced from root 904 to node 908. If the next, or second bit is "O", then the bits are mapped to leaf 910 corresponding to the "b" symbol. More bits are obtained until either an intermediate leaf is reached, i.e., leaf 910, of the last leaf in tree 902 is read in. As shown, the last leaf in tree 902 is leaf 912. As the state-based Huffman decoder involves prefix-free codes, bits "O" are not necessarily associated with leaves. For example, a bit "O" may occur at a node, as for example node 914 that branches to leaf 916 and node 918. Once a leaf is reached, the bits are decoded, and the next bit that is to be obtained corresponds to root 904. That is, the decoding process begins again at root 904 of tree 902.

A table-based single-stage Huffman decoder is useful when there are few bits to be decoded, and does not require significantly more resources than the classic Huffman decoder. However, when there are more than approximately ten bits to be decoded, both the classic Huffman decoder and the single-stage Huffman decoder are somewhat inefficient, and an efficient table-based N-stage Huffman decoder, where N is generally greater than or equal to two, may be implemented.

Referring next to FIGS. 9*b* through 9*e*, a two-stage Huffman decoder will be described in accordance with the present invention. It should be appreciated that the two-stage Huffman decoder is an illustrative example of a general N-stage Huffman decoder that may be used to decode a variety of data encoded using Huffman coding techniques. Such data, as previously mentioned, includes, but is not limited to, motion vectors. In two-stage Huffman decoder table 920, symbols 930 are mapped to bit representations 940. In a two-stage Huffman decoder, any bits that are read into the decoder are generally decoded in two groups. The size of the two groups may be determined by the maximum number of bits associated with a symbol. The process of decoding the first group essentially uses a single-stage Huffman decoder.

Bit representations 940 are divided into a first stage table 942 and two second stage tables 946 and 944. Second stage table 946, associated with first stage bits of "110", and second stage table 944, associated with first stage bits "111", will be referenced as "110" second stage table 946 and "111" second stage table 944 for clarity.

As shown, symbol "a" corresponds to a bit representation of "O", which is a single bit, while symbol "i" corresponds to a bit representation of "111111", which is six bits. In the described embodiment, it may be assumed that symbol "a" is a more likely to occur than symbol "i", as symbol "a" is represented with the fewest number of bits.

Figure 9C:
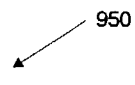
FIG. 9c is a table of a first stage decoding table used with a two stage Huffman decoder according to the present invention.

For the two-stage Huffman decoder of the described embodiment, three consecutive bits are initially obtained for decoding. The three bits are decoded from first stage 942 of bit representations 940 in table 920. A first stage decoding table, as shown in FIG. 9c, may be used in the process of decoding first stage 942. For example, if the three bits of a bit stream are "000", "001", "010" or "011", then first stage 942, shows that the only symbol that has a "O" as a first bit is symbol "a". Therefore, the first "O" bit is decoded as symbol "a". Then the first bit is flushed from the bit stream, as indicated by first stage decoding table 950 of FIG. 9c. After the first bit is decoded and flushed, the remainder of the bit stream is decoded.

If the three bits are "100" or "101", since there is no symbol 930 that is mapped to a bit representation 940 of "1", the first two bits are decoded as symbol "b". After symbol "b" is decoded, the first two bits are flushed, as indicated by first stage decoding table 950 of FIG. 9c. It should be appreciated that the process of decoding bits associated with symbols "a" and "b" in the described embodiment, is essentially a single-stage Huffman process.

If the three bits that are obtained are "110", according to table 950 of FIG. 9c, the three bits are not decoded because there is no unique symbol 930 to which the three bits may be mapped. Therefore, the three bits are flushed from the bit stream, and in the described embodiment, the next two bits are obtained in "110" second stage table 946. Then, a corresponding second stage decoding table, i.e., a "110" second stage decoding table 960 as shown in FIG. 9d, is used to decode "110" second stage table 946.

Figure 9D:
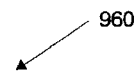
FIG. 9d is a table of a second stage decoding table used with a two stage Huffman decoder according to the present invention.

If the two bits obtained in "110" second stage table 946 are "00" or "O1", then as indicated in "110" second stage decoding table 960 of FIG. 9d, the bits are decoded as symbol "c" and one bit is flushed. Alternatively, if the bits obtained in "110" second stage table 946 are "10" or "11" then the bits are decoded as symbols "d" and "e", respectively, and both bits are flushed.

When the three bits obtained in first stage table 942 are "111", then, as was the case for bits "110," there is no unique symbol 930 to which the three bits may be mapped. Therefore, the three bits are flushed from the bit stream, as indicated in the first stage decoding table 950 of FIG. 9c. And in the described embodiment, "111" second stage table 944 of bit representations 940 is obtained. As shown, while "110" second stage table 946 includes bit representations of two bits, "111" second stage table 944 includes bit representations of three bits.

Figure 9E:
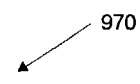
FIG. 9e is a table illustrating another second stage decoding table used with a two stage Huffman decoder according to the present invention.

If the three bits obtained in "111" second stage table 944 are "000", "001", "010" or "011", then, as indicated in "111" second stage decoding table 970 of FIG. 9e, the bits are decoded as symbol "f" and one bit is flushed. Alternatively, if the bits obtained in "111" second stage table 944 are "100" or "101", then the bits are decoded as symbol "g" and two bits are flushed. Finally, if the bits obtained in "111" second stage table 944 are "110", or "111", then the bits are decoded as symbols "h" and "i", respectively, and all three bits are flushed.

Decoding a bit stream using an N-stage Huffman decoder allows for efficient decoding, as bits are obtained in groups, rather than individually. In other words, the ability to decode a group of bits at one time using a look-up table generally reduces the processing that is associated with decoding a bit stream in a bit-by-bit manner. The number of stages in an N-stage Huffman decoder vary widely, depending upon the requirements of a particular decoder. By way of example, for bit representations that include a large number of bits, e.g., approximately twenty bits, more than two stages may be implemented to take full advantage of the efficiency benefits of an N-stage Huffman decoder.

Further, the number of different tables required in a stage vary widely, but is generally determined by the prefixes used in bit representations. By way of example, in the described embodiment, a prefix is defined as a three bit combination. Therefore, there are only two prefixes, the "110" prefix and the "111" prefix, which are each common to more than one bit representation 940. Thus, only two second stage tables 946 and 944 are needed to uniquely decode a bit stream that is associated with table 920. However, if other-prefixes were associated with more than one bit representations, additional second stage tables may be required to uniquely map symbols to bit representations. Alternatively, if only one prefix is associated with bit representations, then only a single second stage table relay be required.

Reference is now made to FIG. 8a for discussion of colorspace conversion from YUV space to RGB space in accordance with an embodiment of the present invention. The process 1000 begins, and in step 1004, pixel values are obtained from a codebook. In the described embodiment, the pixel values are obtained for luminance and chrominance components, e.g., a Y-component, a U-component, and a V-component. It should be appreciated that the pixel values may be obtained using indices obtained from bit streams for the luminance and chrominance components.

It should be appreciated that the pixel values are generally integers. For some components, as for example Y-components, the integers may be unsigned, e.g., the integers range from 0 to 255. For other components, as for example U-components and V-components, the integers may be signed, e.g., the integers range from −128 to +127.

In step 1006, noise, which is to be added to pixel values to account for losses in color accuracy that typically occurs during colorspace conversions, is defined. Flow then proceeds to step 1008.

In step 808, the noise is added to the pixel values. Adding noise to pixel values typically entails dithering the pixels. That is, noise is added to pixel values such that the average value of the entity that is being represented by the pixel values is the average of all of the pixel values. By dithering the pixel values prior to decoding luminance and chrominance data, as opposed to dithering decoded data, the speed of colorspace conversion may be increased. When pixel values are dithered prior to a colorspace conversion, most of the computation associated with dithering may be performed within a codebook. Therefore, there is essentially no computational overhead involved with the dithering process. Flow then proceeds to step 1010.

The addition of noise to the pixel values often results in all overflow of the pixel values. For example, for pixel values associated with Y-components, the addition of noise to the pixel values may result in a new pixel value that is over 255. To eliminate the overflow, the pixel values are clipped in step 1010 to ensure that the pixel values fall within an acceptable range. Flow then proceeds to step 1012.

At step 1012, the pixel values are reduced. Reducing pixel values, in general, involves modifying the pixel values such that they may be represented using six bits, or any other suitable number of bits. Although any appropriate method may be used to reduce pixel values, in the described embodiment, reducing pixel values involves first rounding the clipped pixel values, then dividing the rounded value by four. In another embodiment, reducing pixel values may entail first dividing the clipped pixel values by four, then rounding the divided value. Flow then proceeds to step 1014.

At step 1014, an RGB table is constructed in accordance with a display format. That is, parameters associated with the display on which frames are to be displayed define, at least in part, the manner in which the RGB table is constructed. Flow then proceeds to step 1016.

At step 1016, the reduced pixel values that correspond to luminance and chrominance components are converted into display format RGB space. In other words, Y, U, and V components are converted into the proper RGB format for display on a given display mechanism. It should be appreciated that the steps of constructing an RGB table and converting luminance and chrominance components into a display format, in one embodiment, are essentially the same step. Once the luminance and chrominance components are converted, the process of preprocessing a codebook ends.

Figure 10B:
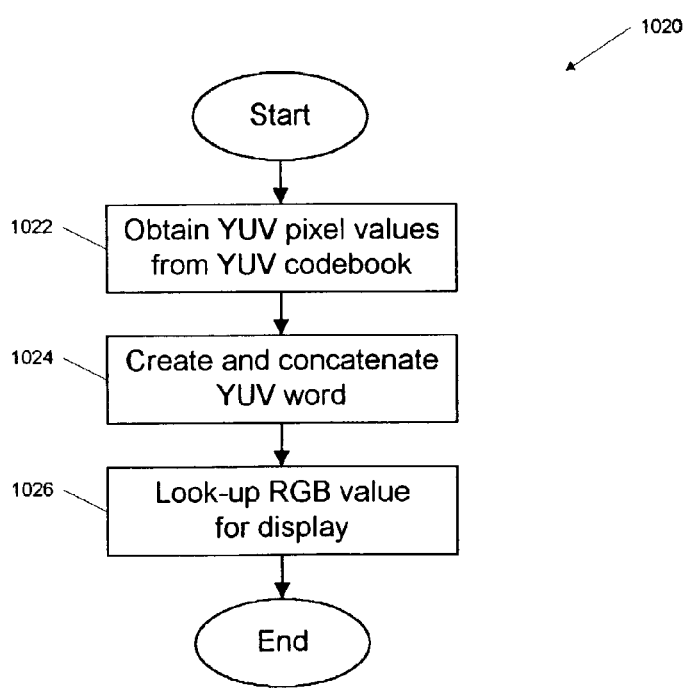
FIG. 10b is a process flow diagram that illustrates the steps associated with performing a color transformation on bits encoded using motion compensation according to the present invention.
Figure 11:
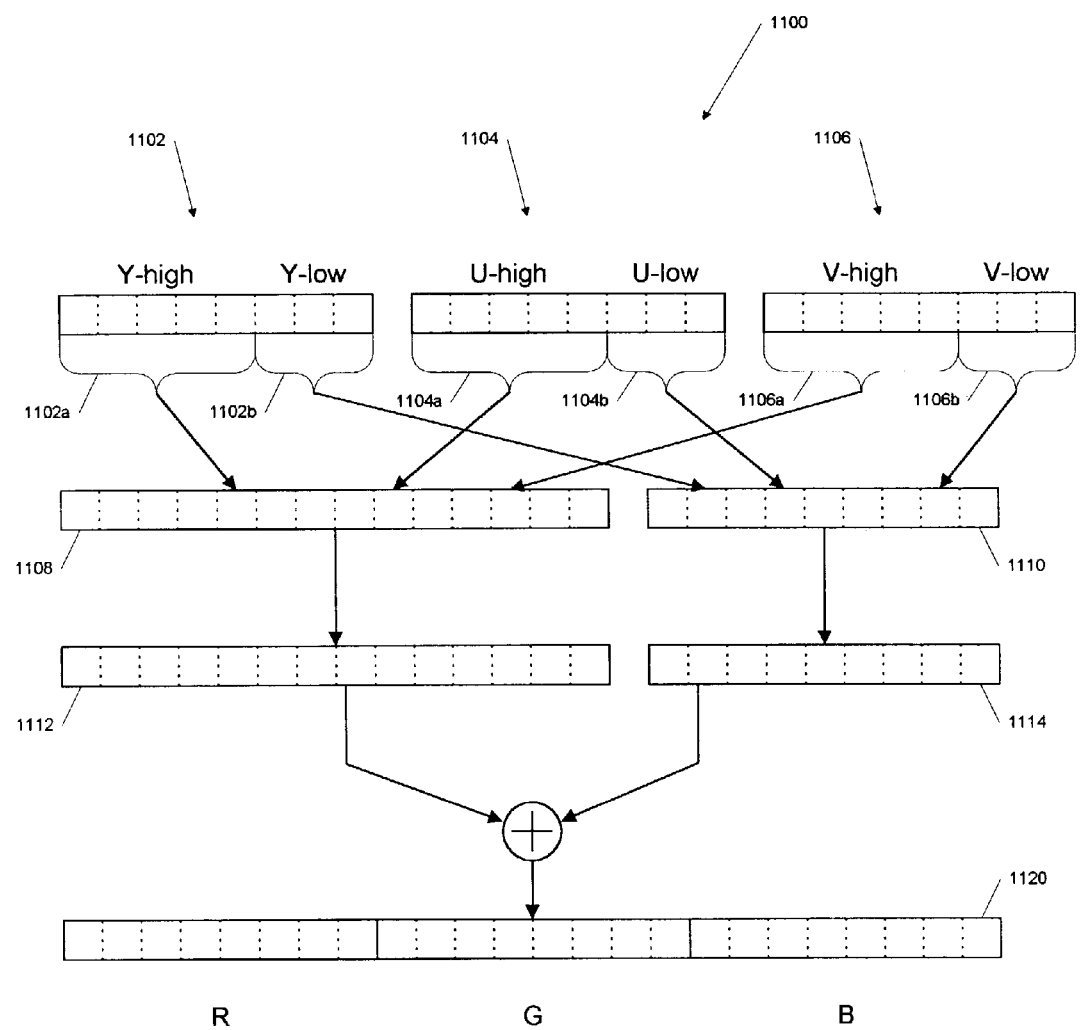
FIG. 11 is a block diagram of a color transformation performed on bits encoded using motion compensation according to the present invention.

Referring next to FIG. 10*b*, a process 1020 of performing a color transformation on bits encoded using motion detection will be described in accordance with an embodiment of the present invention. It should be appreciated that although the process will be described in terms of color transformations from YUV space to colorspace (RGB), color transformations may also be performed from other types of luminance and chrominance space to RGB space.

The process 1020 begins and in step 1022, YUV pixel values are obtained from a YUV codebook. Once the pixel values are obtained, the pixel values are concatenated to form a YUV word in step 1024. As the Y, U, and V pixel values have been processed within the codebook, the concatenated YUV word will not exhibit overflow. The YUV word is used, in step 1026, to look up a corresponding RGB value for display. This RGB value may be obtained from the RGB table that was created as a part of the codebook preprocessing that was previously mentioned with respect to FIG. 8*a*. Once the RGB value is obtained, the process of performing a color transformation is complete.

Referring now to FIG. 9, the transformation of luminance and chrominance components, encoded as a part of a motion estimation, or inter encoding process, into colorspace components, will be described in accordance with an embodiment of the present invention. A Y-component 1102, a U-component 1104, and a V-component 1106 are partitioned into higher order and lower order bits. As will be appreciated by those skilled in the art, colorspace transformations, are typically linear. Hence, it is possible to partition luminance and chrominance components, into higher order and lower order bits. Partitioning maintains the precision of the conversion while reducing the table size.

As shown, Y-component 1102 is partitioned into five higher order bits 1102*a* and three lower order bits 1102*b*. However, it should be appreciated that Y-component 1102 may be partitioned into any suitable combination of higher order bits 1102*a* and lower order bits 1102*b*. Similarly, U-component 1104 is partitioned into higher order bits 1104*a* and lower order bits 1104*b*, and V-component 1106 is partitioned into higher order bits 1106*a* and lower order bits 1106*b*.

Once the components are partitioned into higher order and lower order bits, the higher order bits and the lower order bits are separately transformed into RGB space and saved into a lookup table. As many standardized transformation matrices are available, it should be appreciated that the actual values used in file colorspace transformations may be vary widely.

Once transformed, versions of higher order bits 1102*a*, 1104*a*, and 1106*a* are arranged in a high order RGB table 1112. Similarly, transformed versions of lower order bits 1102*b*, 1104*b*, and 1106*b* are arranged in a low order RGB table 1114.

The number of bits in high order RGB table 1112 and low order RGB table 1114 is dependent upon the number of higher order bits 1102*a*, 1104*a* and 1106*a*, as well as the number of lower order bits 1102*b*, 1104*b* and 1106*b*, respectively. Hence, in the described embodiment, high order RGB table 1114 includes fifteen bits, and low order RGB table 1114 includes nine bits.

The bits in high order RGB table 1112 are clipped so that when the bits in high order RGB table 1112 are eventually added to the bits in low order RGB table 1114, all overflow of bits is avoided. The bits in low order RGB table 1114 are examined to identify the largest value which may be generated from low order RGB table 1114. This largest value is then clipped from high order RGB table 1112. It should be appreciated that although U-component 1104 and V-component 1106 are typically signed, under flow problems do not occur because partitioning a signed 2's component number leaves the upper partition signed and the lower partition unsigned.

This process of transforming to RGB and clipping is repeated for substantially all possible combinations of the high order bits of YUV to construct RGB high table 1112, and substantially all possible combinations of the low order bits are used to construct RGB low table 1114.

When a color transformation on bits encoded using a motion estimation process is desired, in the described embodiment, YUV pixel values may be obtained from a YUV codebook. The YUV pixel values obtained from the codebook may then be partitioned into high bits 1102*a*, 1104*a* and 1106*a*, and low bits 1102*b*, 1104*b* and 1106*b*. High YUV word 1108 is constructed by concatenating high bits 1102*a*, 1104*a* and 1106*a*, and low YUV word is constructed by concatenating low bits 1102*b*, 1104*b* and 1106*b*. High YUV word 1108 and low YUV word 1110 may be used to lookup corresponding high and low RGB values in RGB high table 1112 and RGB low table 1114, respectively. The high RGB values and the low RGB values are then added to obtain final RGB value 1120.

The above discussion has concentrated primarily on the encoding and decoding of blocks within a frame, without regard to the size of the block. More specifically, discussion has been directed to either a macroblock of size 16×16 pixels, or a block of 8×8 pixels. However, as was mentioned above, other block sizes may be used for encoding, to provide better compression for a particular bit rate. One aspect of the present invention is that the methods discussed above, may be recursively performed on varying block sizes to obtain the best block size for compression. This is explained below with reference to FIG. 12.

Figure 12A:
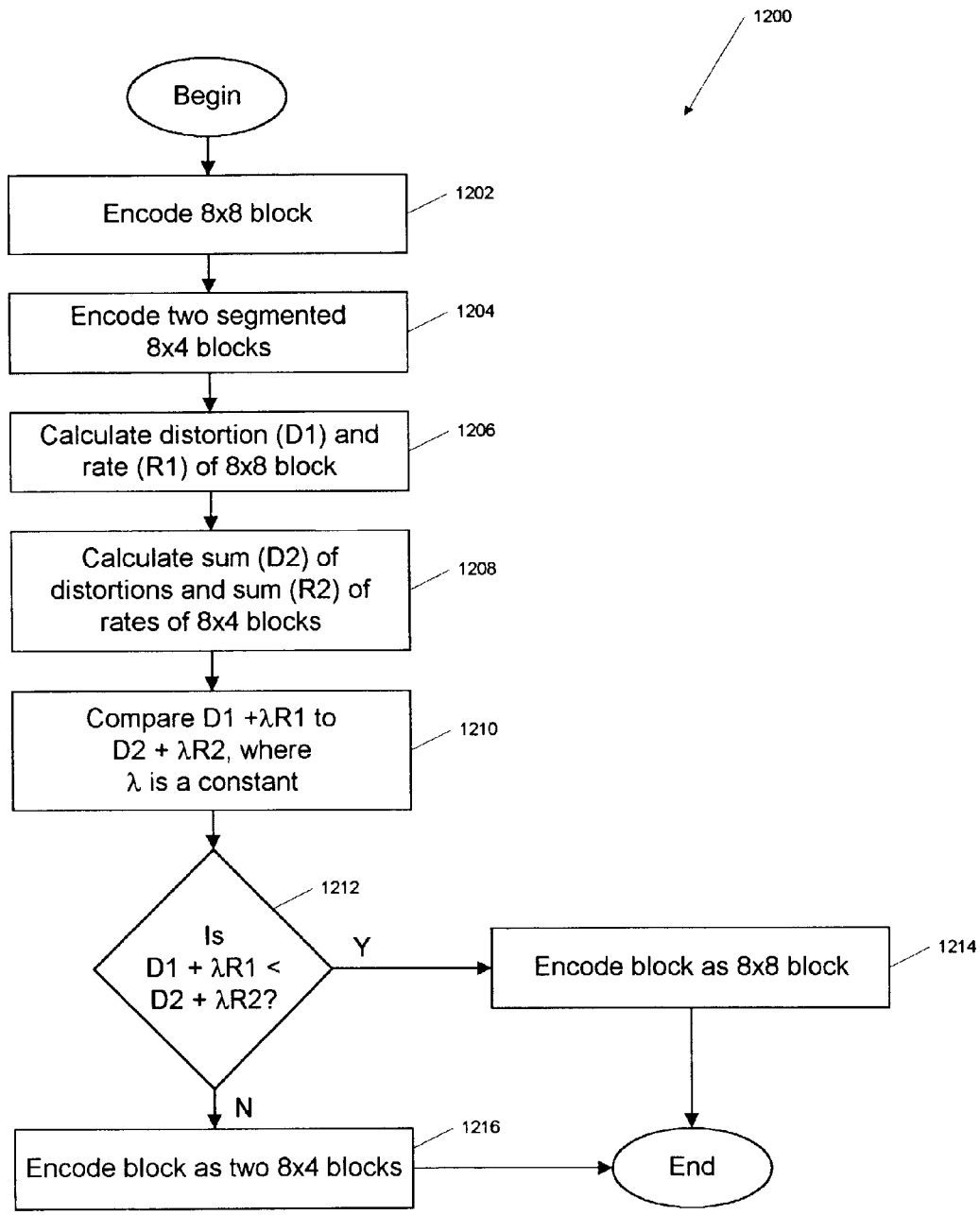
FIG. 12a is a process flow diagram illustrating a segmentation process for blocks in accordance with the present invention.
Figure 12B:
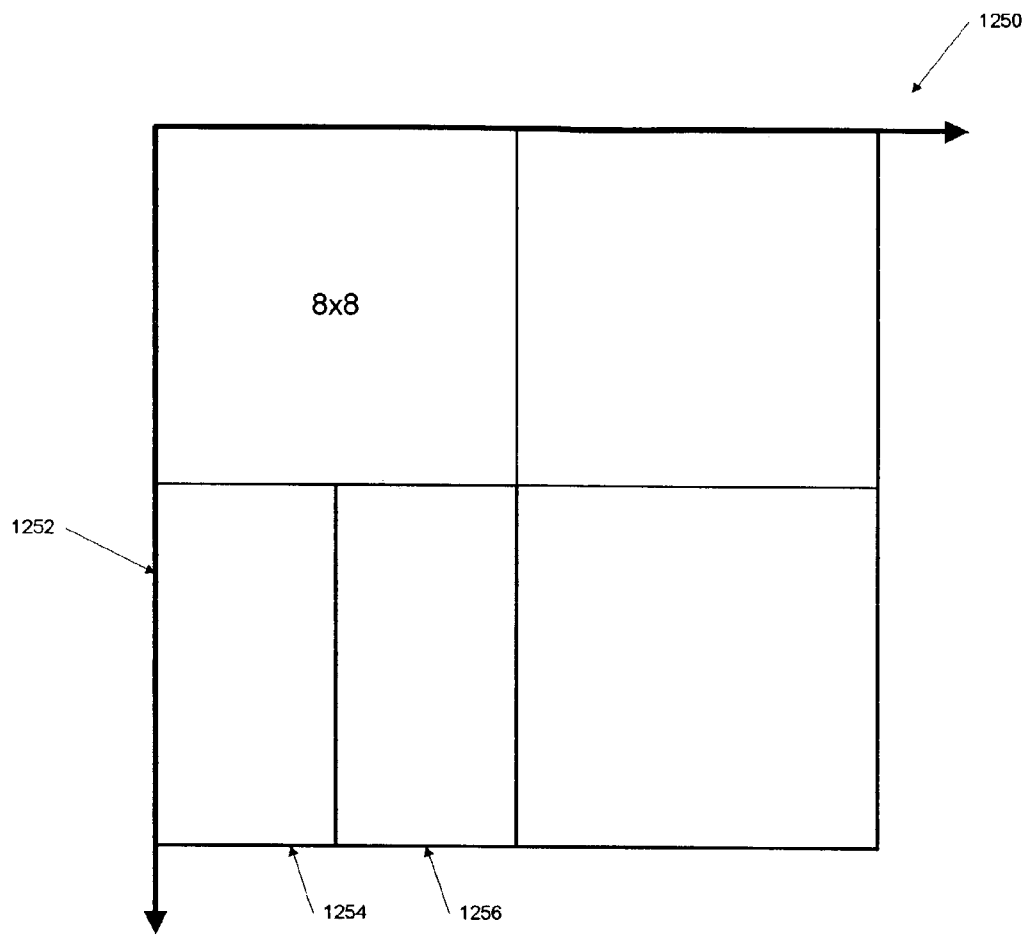

In FIG. 12a, a process flow diagram 1200 is shown that illustrates the steps associated with a segmentation process according to the present invention. The segmentation process is recursive. That is, blocks of different sizes may be encoded during the segmentation process, for selection of the best block size for ultimate encoding. For example, small blocks may be encoded to determine if they provide better compression, or image quality, for a given bit rate, than larger block sizes.

The segmentation process 1200 begins at step 1202 wherein a portion of a macroblock 1250 (referring to FIG. 12b) is encoded as a block 1252 of a specific size. For purposes of illustration, the macroblock 1250 is of size 16×16 pixels, and the block 1252 encoded at step 1202 has a size of 8×8 pixels. The block is encoded using any suitable compression process, but in the present embodiment is encoded using the adaptive compression codebook process described in the above referenced U.S. patent application Ser. No. 08/623,299. The 8×8 block 1252 is considered a non-segmented block. Flow then proceeds to step 1204.

At step 1204, the non-segmented, non encoded block 1252 is segmented into two smaller blocks of size 8×4 pixels, illustrated as blocks 1254 and 1256. These two smaller blocks 1254, 1256 are also encoding using the adaptive compression codebook process referenced above. Flow then proceeds to step 1206.

At step 1206, the distortion D1 and the rate R1 of the 8×8 block 1252 is are calculated. The distortion of a block is an indicator of the overall quality degradation of the encoded block as compared to the original block. The rate of a block is a measure of the number of bits that may be transmitted over a given channel for the block. In the described embodiment, the rate of a block includes bits that represent an index for the block as well as bits that represent an encoding map tree, or segmentation tree, representing a map that is used to encode the block. This will be described below with reference to FIG. 12c. Methods used to calculate distortion and rate are generally well known. In one embodiment, distortion and rate is determined using squared error calculations. Flow then proceeds to step 1208.

At step 1208, the sum D2 of distortions and the sum R2 of rates of the 8×4 blocks 1254, 1256 are calculated. Flow then proceeds to step 1210.

At step 1210, a constant lambda λ is defined and the quantities D1+λR1 and D2+λR2 are calculated and compared. The process for determining appropriate values for λ which is a rate control parameter, is analogous to the process of determining a quality parameter as described in co-pending U.S. Patent Application Ser. No. 08/819,507 (now U.S. Pat. No. 6,118,817). In general, values for λ range from 00 to 100 distortion units per bit, where a value of 0 places a complete emphasis on distortion and a value of 100 places an equal emphasis on rate. Flow then proceeds to decision step 1212.

At step 1212, a determination is made as to whether D1+λR1 is less than D2+λR2. The purpose of the comparison is to minimize the sum of distortion D and rate R. By minimizing the distortion and rate, the best quality resolution for a particular bit rate may be obtained. If it is determined that the quantity D1+λR1 is less than D2+λR2, then the encoded 8×8 block 1252 is deemed acceptable, and flow proceeds to step 1214. If it is determined that the quantity D1+λR1 is greater than D2+λR2, then encoding the 8×8 block 1252 is considered an inadequate representation of the block 1252, as compared to encoding the two segmented 8×4 blocks 1254, 1256. Flow then proceeds to step 1216.

At step 1214, the 8×8 block 1252 is encoded, and the segmentation process ends.

At step 1216, the 8×8 block 1252 is segmented into two 8×4 blocks 1254, 1256, and encoded as two 8×4 blocks. After encoding the segmented blocks 1254, 1256, the segmentation process ends.

It should be appreciated that, due to the recursive nature of the segmentation process, the two segmented 8×4 blocks 1254, 1256 may further be encoded as segmented 4×4 sub-blocks, and comparisons made to determine whether the 8×4 blocks are acceptable, or whether 4×4 sub-blocks are necessary. In fact, the segmentation process can continue until the process is comparing encoded 1×1 blocks, although typically blocks are not segmented smaller than 2×2.

Figure 12C:
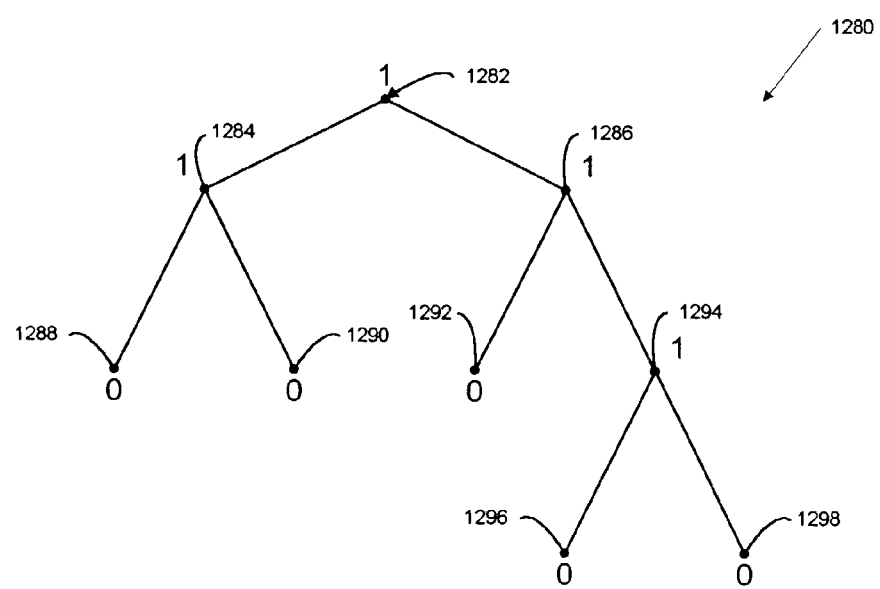
Figure 12D:
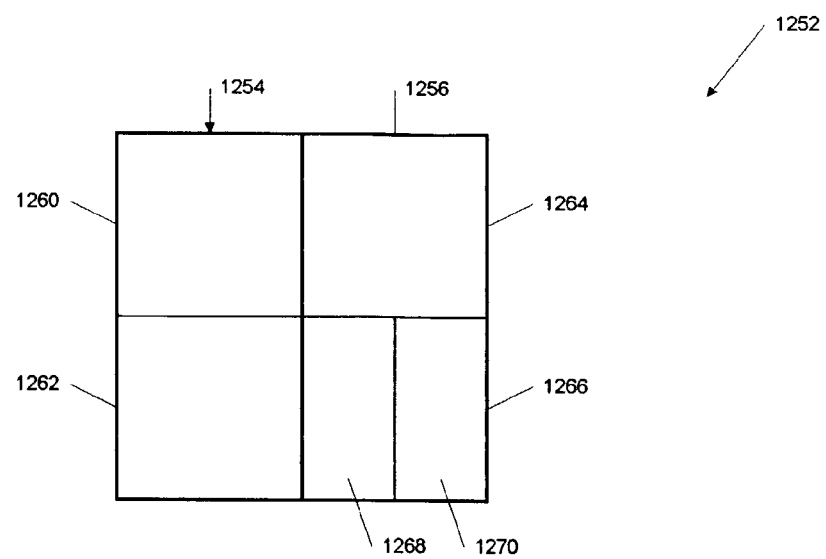
FIG. 12d is an block diagram of a block that is segmented according to the segmentation process of FIG. 12a, and represented by the encoding map tree of FIG. 12c.

Referring now to FIGS. 12c and 12d, an encoding map tree for a block 1252 will be described. A tree 1280 has a root node 1282 that represents the 8×8 block 1252. Node 1282, which is identified by a designation of one, branches off to nodes 1284 and 1286 which represents segmentation of block 1252 into two 8×4 blocks 1254, 1256. In one embodiment, the designations of one indicate that a block is being further split into smaller blocks, while a designation of zero indicates that a block has been encoded.

Node 1284 is split into two nodes 1288, 1290 which represent two 4×4 blocks 1260, 1262. As nodes 1288 and 1290 are not further split, the blocks 1260, 1262 are encoded.

Like node 1284, node 1286 also branches off into two nodes 1292 and 1294. Node 1292 has a designation of zero, indicating that 4×4 block 1264 is encoded. On the other hand, node 1294 has a designation of one, indicating that 4×4 block 1266 is further split into two 4×2 blocks 1268, 1270. Nodes 1296 and 1298 each have a designation of zero indicating that the 4×2 blocks 1268, 1270 are encoding without further segmentation.

Figure 13:
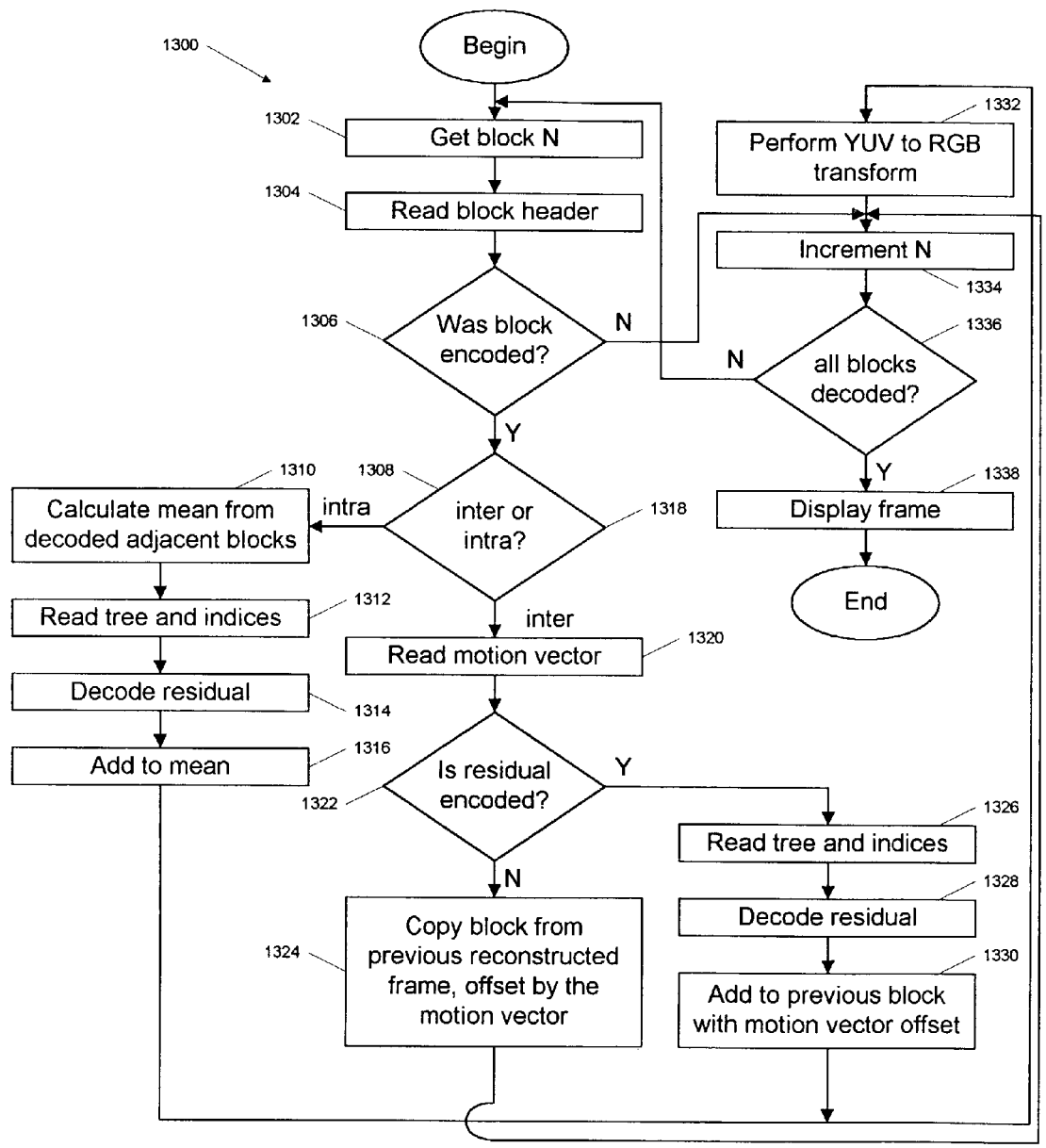
FIG. 13 is a process flow diagram illustrating the steps of decoding blocks in a frame that has been encoded and transmitted by the motion compensation, segmentation and encoding methods of the present invention.

Referring next to FIG. 13, a process 1300 of decoding blocks transferred over a network, and displaying a frame, will be described according to the present invention. The process 1300 begins at step 1302 where a first block N is read for a frame. Flow then proceeds to step 1304.

At step 1304, the block type for block N is read. Recall, a block type is provided for each block to indicate whether the block was compressed. If the distance between the present block and the previous block was less than a specified threshold, a block header of zero was transmitted, and the block was not encoded for transfer. See discussion above with reference to FIG. 6b. Flow then proceeds to decision step 1306.

At step 1306, the block header is used to determine whether the block was encoded. If it was not encoded, indicating that the block can be reconstructed from a block in the same spatial location of a previous frame, flow proceeds to step 1334.

At step 1334, N is incremented to get the next block in the frame. Flow then proceeds to decision step 1336.

At step 1336, a determination is made as to whether there are any more blocks in the frame. If so, instruction flow proceeds back to step 1302 to obtain another block. If not, indicating that all of the blocks in a frame have been processed, then flow proceeds to step 1338. At step 1338, the frame is displayed, ending the decoding process for the frame. It should be appreciated that the process 1300 is then repeated for all frames within a video sequence.

If at step 1306 it is determined that the block was encoded, process flow proceeds to decision step 1308.

At step 1308, it is determined whether the block was compressed using inter or intra compression. If intra compression was used, flow proceeds to step 1310. If inter compression was used, flow proceeds to step 1320.

At step 1310, decoding of an intra compressed block begins. Recall, in one embodiment of the present invention, intra compression of a block was described above with reference to FIG. 8. Step 1310 calculates the mean for the block using the adjacent pixels from previously decoded blocks within the present frame. Flow then proceeds to step 1312.

At step 1312 where the encoding map tree and indices are read. The encoding map tree and indices include information on how the block was encoding, and the segmentation used for the block. Flow then proceeds to step 1314.

At step 1314, the residual for the block is decoded. In a preferred embodiment, decoding of the block is performed using the adaptive compression method described above in U.S. patent Ser. No. 08/623,299. Flow then proceeds to step 1316.

At step 1316, the decoded residual is added to the calculated mean. Instruction flow then proceeds to step 1332.

At step 1332, a transform is performed on the block to convert the pixel values from YUV space to RGB space, as described above with reference to FIGS. 10 and 11. Instruction flow then proceeds to step 334, and following, as described above.

If, at step 1308, it is determined that inter compression was used, flow proceeds to step 1320.

At step 1320, the motion vector for the block is read. Instruction flow then proceeds to decision step 1322.

At step 1322, it is determined whether a residual was encoded. If so, then flow proceeds to step 1326. If not, then flow proceeds to step 1324.

At step 1324, since no residual was encoded, the motion vector is used to reconstruct the block from a block in a previous frame, offset by the motion vector. Instruction flow then proceeds to step 1334 and following.

At step 1326, the encoding map tree and indices are read for the block. Flow then proceeds to step 1328.

At step 1328, the residual for the block is decoded using the adaptive compression method described above. Flow then proceeds to step 1330.

At step 1330, the residual is added to a previous reconstructed block with a displacement specified by the motion vector read in step 1320. Flow then proceeds to step 1332 and following, as described above.

This completes the process 1300 for decoding blocks within a frame, transmitted over a network. One skilled in the art should appreciate that the process 1300 may be executed on a receiving device, such as the computers 108, 112 described above with reference to FIG. 1. And, the encoding described in this application may be performed on either the computers 108, 112, or on a server 102 such as that described in FIG. 1. Moreover, the video frames that are transmitted may reside on any of the computers shown in FIG. 1, or on some other storage medium such as the optical drives 104. Furthermore, one skilled in the art should appreciate that blocks within a video frame may not be transmitted together, but may be streamed over the transmission medium to the receiving device.

Although the present invention has been described in considerable detail with reference to certain preferred versions thereof, other versions are possible. For example, alternative encoding and compression schemes may be developed that provide optimal encoding of video blocks, or a combination of video blocks with audio information, but that still utilize the recursive segmentation of blocks as described above, or the block by block selection of compression methodology as described in the present invention.

Those skilled in the art should appreciate that they can readily use the disclosed conception and specific embodiments as a basis for designing or modifying other structures for carrying out the same purposes of the present invention. In addition, it should be understood that various changes, substitutions and alterations can be made herein without departing from the spirit and scope of the invention as defined by the appended claims.

The invention claimed is:

1. In a computer system, a computer-implemented method of decoding one or more video frames in a video sequence, the method comprising:
  for a plurality of blocks of pixels in a current video frame of the video sequence, selecting between multiple types, the multiple types including a first type and a second type;
  if the selected type is the first type, decoding the plurality of blocks using inter-frame prediction with motion compensation, including computing one or more predictors for the plurality of blocks relative to a reference video frame; and
  if the selected type is the second type, decoding the plurality of blocks using intra-frame spatial prediction of pixel values, including for each block in the plurality of blocks:
    obtaining one or more pixel values for spatial prediction of pixel values of the block, wherein the one or more obtained pixel values for at least one of the plurality of blocks are from spatially adjacent pixels wherein:
      if the block is the top left block of the current video frame, the one or more obtained pixel values consist of a gray value,
      otherwise, if the block is in the top row of the current video frame, the spatially adjacent pixels consist of pixels immediately left of the block,
      otherwise, if the block is in the left column of the current video frame, the spatially adjacent pixels consist of pixels immediately above the block,
      otherwise, the spatially adjacent pixels consist of the pixels immediately left of the block and the pixels immediately above the block;
    predicting the pixel values of the block from the one or more obtained pixel values, and
    reconstructing the block from the predicted pixel values and a residual.

2. The method of claim 1 wherein the current video frame is in YUV format.

3. The method of claim 1 wherein the plurality of blocks is for a macroblock.

4. The method of claim 1 wherein the predicting includes computing the mean of the one or more obtained pixel values.

5. The method of claim 4 wherein the reconstructing includes adding the mean to the residual, and wherein calculation of the residual during encoding includes subtracting the mean from the pixel values of the block.

6. The method of claim 1 wherein the selecting is based upon type information in a bitstream of encoded data for the video sequence.

7. One or more computer-readable media storing computer-executable instructions for causing the computer system to perform the method of claim 1.

8. The method of claim 1 wherein each of the plurality of blocks is a 4 by 4 pixel blocks.

9. The method of claim 1 wherein the gray value is 128.

10. One or more computer-readable media storing computer-executable instructions for causing a computer system programmed thereby to perform a method of decoding one or more pictures in a video sequence, the method comprising:
   selecting between multiple types for plural blocks of pixels in a picture of the video sequence, the multiple types including a first type and a second type;
   if the selected type is the first type, decoding the plural blocks as the first type; and
   if the selected type is the second type, decoding the plural blocks with spatial prediction of pixel values, including, for each block in the plural blocks,
      obtaining one or more pixel values, wherein if the block is the top left block of the picture, the one or more obtained pixel values consist of a gray value, otherwise, if the block is in the top row of the picture, the one or more obtained pixel values are from pixels immediately left of the block, otherwise, if the block is in the left column of the picture, the one or more obtained pixel values are from pixels immediately above the block, and otherwise, the one or more obtained pixel values are from the pixels immediately left of the block and the pixels immediately above the block, and
      predicting pixel values of the block from the one or more obtained pixel values.

11. The one or more computer-readable media of claim 10 wherein the picture is in YUV format.

12. The one or more computer-readable media of claim 10 wherein the plural blocks form a macroblock.

13. The one or more computer-readable media of claim 10 wherein the predicting includes computing the mean of the one or more obtained pixel values.

14. The one or more computer-readable media of claim 10 wherein if the selected type is the second type, the decoding the plural blocks further comprises reconstructing the plural blocks from residuals for the plural blocks and the predicted pixel values of the plural blocks.

15. The one or more computer-readable media of claim 10 wherein the selecting is based upon type information associated with the plural blocks.

16. The one or more computer-readable media of claim 10 wherein the picture is a video frame.

17. A method of decoding one or more video frames in a video sequence, the method comprising:
   receiving encoded data for a current video frame; and
   decoding the encoded data for the current video frame, including
      decoding a first plurality of blocks of pixels in the current video frame as inter type with motion compensation, including computing one or more predictors for the first plurality of blocks relative to a reference video frame using motion compensation;
      decoding a second plurality of blocks of pixels in the current video frame as intra type with spatial prediction of pixel values, including for each respective block of the second plurality of blocks:
         obtaining one or more pixel values for spatial prediction of pixel values for the respective block, wherein the one or more obtained pixel values for at least one of the second plurality of blocks are from spatially adjacent pixels, wherein
            if the respective block is the top left block of the current video frame, the one or more obtained pixel values consist of a gray value,
            otherwise, if the respective block is in the top row of the current video frame, the spatially adjacent pixels consist of pixels immediately left of the respective block,
            otherwise, if the respective block is in the left column of the current video frame, the spatially adjacent pixels consist of pixels immediately above the respective block, and
            otherwise, the spatially adjacent pixels include the pixels immediately left of the respective block and the pixels immediately above the respective block; and
         predicting the pixel values of the respective block from the obtained pixel values.

18. The method of claim 17 wherein the current video frame is in YUV format.

19. The method of claim 17 wherein the first plurality of blocks and the second plurality of blocks form respective macroblocks.

20. The method of claim 17 wherein the predicting includes computing the mean of the one or more obtained pixel values.

21. The method of claim 17 wherein the decoding the second plurality of blocks further comprises reconstructing each respective block from a residual and the predicted pixel values of the respective block.

22. The method of claim 17 wherein the method further comprises, for the first plurality of the blocks and for the second plurality of the blocks, selecting between inter type and intra type based upon type information in the encoded data.

* * * * *